United States Patent
Green

(10) Patent No.: US 6,600,432 B2
(45) Date of Patent: Jul. 29, 2003

(54) VARIABLE LENGTH ENCODING AND DECODING OF ASCENDING NUMERICAL SEQUENCES

(75) Inventor: Robin A. R. Green, Toronto (CA)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/210,354

(22) Filed: Jul. 31, 2002

(65) Prior Publication Data

US 2003/0122694 A1 Jul. 3, 2003

(51) Int. Cl.$^7$ ................................................ H03M 7/40
(52) U.S. Cl. ........................................ 341/67; 341/95
(58) Field of Search ........................ 341/67, 60, 86, 341/50, 51, 95

(56) References Cited

U.S. PATENT DOCUMENTS

| | | | | |
|---|---|---|---|---|
| 5,832,531 A | * | 11/1998 | Ayers | 715/500 |
| 5,907,297 A | * | 5/1999 | Cohen et al. | 341/95 |
| 6,205,442 B1 | * | 3/2001 | Cohen et al. | 707/2 |
| 6,326,907 B1 | * | 12/2001 | Harada | 341/51 |

* cited by examiner

Primary Examiner—Brian Young
Assistant Examiner—John Nguyen
(74) Attorney, Agent, or Firm—David A. Mims, Jr.

(57) ABSTRACT

An ascending numerical sequence, such as an index of word position values within a file, is variable length binary encoded, and subsequently decoded to derive the original sequence. Encoding involves obtaining certain properties of the sequence, including the first and last element values and the maximum and minimum gaps. Unless the maximum and minimum gaps are equal, each element value between the first and last element of the sequence is reduced and the reduced sequence is further encoded, all according to various rules. Reduction involves stripping the leading 0 bit's and the first 1 bit. In most other circumstances, the resulting binary value is simply stored in a bitstream. If the maximum and minimum gaps are the same then the first and last values and the minimum and maximum gaps are simply stored in a header and no body is stored as the sequence is fully defined. When the length of the body is known then a header is stored that contains the properties of the sequence that permit the sequence to be decoded from the header and body. Corresponding rules permit the decoding of the sequence from the header and body.

32 Claims, 19 Drawing Sheets

```
. . . . . . . . . . . . . . . . . . .
. . . . . . . . . . .XX . XXX . . . . .
. . . . . . . . . .X . . X .X .X . . .
. . . . . . . . . X . . . .XXX . . . .
. . . . . . . . . X . . . . . . . . . .
. . . . XXX XXX XXX . . . . . . . .
. . . . . XX . . . XX . . . . . . . . .
. . . . . . XX . XX . . . . . . . . . .
. . . . XX . . . . . XX . . . . . . . .
. . . XX . . . . . . . XX . . . . . . .
. . . XX . . . . . . . XX . . . . . .
. . . . XX . . . . . . XX . . . . . . .
. . . . . . .XX X XX . . . . . . . . . .
```

Figure 19

VARIABLE LENGTH ENCODING AND DECODING OF ASCENDING NUMERICAL SEQUENCES

FIELD OF THE INVENTION

The invention relates to the compression of sequences of numeric data.

BACKGROUND OF THE INVENTION

Many computer applications involve storing and accessing long sequences of values that increase in value as one progresses through the sequence. Referring to FIG. 1, for example, a search engine may store occurrence data for the location of a given word in a given file. The occurrence data may be represented as a sequence of elements, each successive element ascending in value. The values indicating the position within the file where the word appears.

Such sequences consume a great deal of space. This consumes a great deal of memory and other system resources. It also affects the speed at which the data can be stored and accessed. Obviously, this is a significant issue for computer applications, particularly those applications where the results are intended to be provided in real time, perhaps to remote users.

Depending on the application, slower storage and access and larger resource requirements can have a significant commercial effect. For example, a user of a slow internet search engine can easily decide to use an alternative engine, resulting in a loss of revenue.

Many different techniques have been proposed to make the storage and accessing of computer data more efficient. For example, Cohen discloses an Optimization of Data Representations for Transmission of Storage Using Differences from Reference Data in U.S. Pat. No. 5,977,889 issued Nov. 2, 1999. Cohen compresses a representation of differences between a base sequence of data and the actual data to be transmitted or stored.

Tsai et al discloses a Method for Reducing Storage Requirements for Grouped Data Values in U.S. Pat. No. 5,818,877 issued Oct. 6, 1998. The method generates a reduced number of values representing a sequence of grouped data values and partitions the reduced number of values by first mapping data values into groups of symbols and then partitioning the resulting stream of symbols.

None of these techniques are optimized directly for numerical values in ascending sequence. It is desirable to have such methods.

SUMMARY OF THE INVENTION

In a first aspect the invention provides a method of compressing ascending order numerical data in a computer system. The method determines the minimum and maximum gaps between the data set, and reduces all values in the data set except for the first and last values using the formula:

reduced element value=original element value−first element value−((minimum gap−1)×current position in sequence)

Where:
original element value is the value being reduced, first element value is the value of the first element in the sequence (also the first value in the array and the lowest possible value),
minimum gap is the smallest distance between any two adjacent elements in the sequence,
current sequence position in the sequence is the current element's position within the sequence (array), where position 0 is that of the first element in the sequence, and
X is a multiplication sign The method then stores for each sequence the first and last values, the number of bits required to represent the reduced second element, the number of bits required to store the entire sequence, and discards all leading zeros bits and first non zero bits.

In a second aspect the invention provides a method of encoding a sequence of elements of ascending numerical value. The method reads the sequence of elements of ascending numerical values from a medium using a computer system, determines a minimum gap and a maximum gap of the sequence, reduces each element value according to the formula of the first aspect. After reduction, and in a binary representation of each reduced value, the method strips any leading zero bits and the first non-zero bit, stores the resulting values in a body as a bitstream, and stores in a header the first value, last value, minimum gap and maximum gap of the original sequence, the number of bits in the first value in the body, and an indicator of the start and the end of the body.

The method may, after stripping the leading bits, if the reduced value and the reduced value plus the maximum gap have the same number of bits and there are any remaining leading bits that are the same in the reduced value and the reduced value plus the maximum gap then drop the remaining leading bits that are the same.

The method may, after stripping the leading bits, if the current stripped value has N+1 bits and the previous stripped value in the sequence has N bits and the value of the first N bits of the current stripped value is not less than the previous stripped value then insert in the body before the current stripped value a bump code to the number of bits in the current stripped value.

The method may, after stripping the leading bits, if the current stripped value has N+1 bits and the previous stripped value in the sequence has N bits and the value of the first N bits of the current stripped value is not less than the previous stripped value then insert in the body before the current stripped value a bump code to the number of bits in the current stripped value.

The method may, after stripping the leading bits, if the current stripped value has N+1 bits and the previous stripped value in the sequence has N bits and the value of the first N bits of the current stripped value is less than the previous and the stripped value has N zeros bits stripped value then insert in the body before the current stripped value a bump code to the number of bits in the current stripped value.

The method may, after the determining step, if the maximum gap is the same as the minimum gap then only store in a header the first value, last value, minimum gap and maximum gap of the original sequence, and not store a body.

In a third aspect the invention provides a method of decoding a sequence of ascending numerical values from a header and an optional body of data. The method reads the header from a medium utilizing a computer system to obtain for a sequence the first element value, last element value, minimum gap, maximum gap. If the body exists then the method reads the header to obtain an indication of the start of the body, the length of the first binary value in the body, and the end of the body, and determines if the minimum gap and the maximum gap are the same, and if so then computes the sequence of values from the header. If the minimum gap and the maximum gap are not the same then the method decodes a first binary value in the body from a medium using a computer system and adds in a leading bit, and continues to read the next value. If the read binary value is not a bump code and the value is not greater than the previous binary value then reads an additional bit from the body and adds a leading one bit to the actual binary value to obtain one of the sequence of values. If the read binary value is not a bump code and the value is greater than the previous binary value then the method adds a leading one bit to the actual binary value to obtain one of the sequence of values. If the read binary value is a bump code then the method reads the number of bits specified by the bump code to obtain the actual binary value and then adds a leading one bit to the actual binary value to obtain one of the sequence of values. If the value is not the last value in the body then the method continues above at reading the next value.

Reading the next value may include, if leading bits of the value were dropped on encoding because the bits were the same as in the preceding value then reading the number of bits from the preceding value after the leading bits that are the same, adding in the leading bits that are the same, adding a leading one to the value, and continuing to read the next value. Reading the next value may include, if leading bits are not the same then continuing to read the same number of bits from the body as for the previous value.

The header may store the number of bits for the first binary value in the body, and if the current value is the first value in the body then decoding the first binary value by reading a number of bits stored in the header for the first binary value, and adding an additional bit to the value.

The original sequence values may represent the word or character positions of succeeding occurrences of a particular text word in a digital file.

The original sequence values may be derived from a sequence of descending numeric values by subtracting succeeding values of the descending sequence from the first descending sequence value then performing the encoding of the derived sequence values.

The original sequence values may be stored in the header and no body created in the event that the sequence contains 8 or fewer elements.

The original sequence values may represent credit card numbers having a particular property selected from one of stolen, expired, active, or overextended.

In addition to many other applications, the original sequence values may represent unique numeric ID values for fast validation lookup, timestamps for a transaction, expansion data for thermal explosions, a bitmap of a graphical image possibly in a 3-dimensional space, an inverted list of pointers to matching records, sorted numeric values including succeeding values that can be equal to the preceding value, a sequence of telephone numbers accessible from a router in a network in ascending order, a sequence of IP addresses available from a computer network router system, values used in a crytographic application to encrypt successive groups of bits of transmitted data, locations within geographical information systems of a particular object, the amount of potential energy remaining in an object or energy source, temperature changes during an energy-producing reaction, or timestamps for process control and environmental state monitoring events.

The ascending sequence may be broken down and encoded as a set of headers and bodies.

In a fourth aspect the invention provides systems for encoding a sequence of elements of ascending numerical value. Each system has means to carry out the respective steps of the methods.

In a fifth aspect the invention provides systems for encoding a sequence of elements of ascending numerical value. The systems each have a computer system that can carry out the steps of the respective methods.

In a sixth aspect the invention provides encoded digital data on a medium. The digital data takes a form that results from the application of a respective one of the methods.

BRIEF DESCRIPTION OF THE DRAWINGS

For a better understanding of the present invention and to show more were clearly how it may be carried into effect, reference will now be made, by way of example, to the accompanying drawings that show the preferred embodiment of the present invention and in which:

FIG. 19 is a bit pattern of a flower and vase as an example graphical bitmap on which the methods may be employed.

DETAILED DESCRIPTION OF THE PREFERRED EMBODIMENT

It is to be understood that the methods described herein are described with reference to particular embodiments and Figures. Particular orders of steps described or shown are not to be understood as limiting the scope of the general aspects of the invention provided that the result for the intended purpose is the same. As will be understood by those skilled in the art it is often possible to perform steps in a different order yet obtain the same result, particularly when implementing methods using computer technology.

Figure 2:
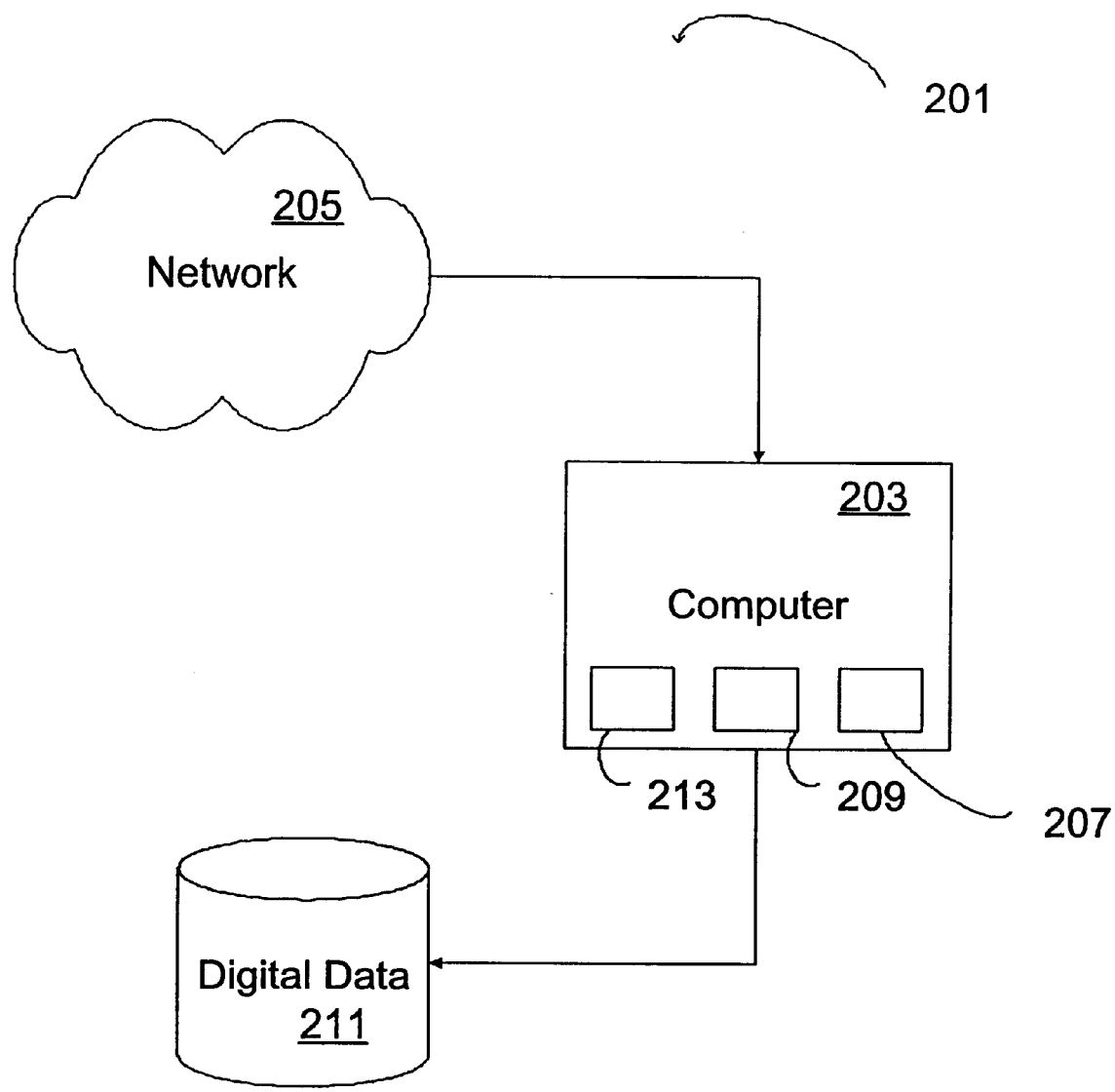
FIG. 2 is a schematic representation of a computer system embodying the preferred embodiment of the invention.

Referring to FIG. 2, the methods described herein are typically embodied in the form of a programmed computer system 201. The computer system 201 may be, for example, a standalone computer 203 or include a network 205. Separate computer programs, for example, 207, 209 may be used to compress and to decompress, respectively, a sequence from one computer, the compressed data may be transmitted to another computer where a decompression program may be used to decompress the compressed data.

The methods may alternatively be embodied in dedicated hardware in a computer system to provide additional performance enhancement. Other computer system embodiments will be evident to those skilled in the art.

Digital data that is to be compressed or decompressed will typically be accessed from a medium such as a disk subsystem 211 of the computer system 201. It may also be accessed from other media, such as, for example, a signal transmitted on a telecommunications link (wired or wireless) from network 205 (which may be the Internet or another network), or from memory 213 as a result of prior processing within the computer system 201.

Most computer systems store data with a given number of bits reserved for each element of data based on a datatype used in a particular programming environment. Such formats often contain redundant information. The methods described herein recognize that sequences of ascending numerical data represented in binary format can contain redundant information with particular properties, and the methods exploit those properties.

As will be recognized by those in the art, virtually all computer systems ultimately store data in binary format. In some aspects, the methods described herein utilize variable length binary encoding. This results in a variable number of bits per value being represented. In order to utilize most of the methods described herein, it will be necessary to be able to store and retrieve a variable number of bits in a binary representation. Those in the art will recognize that there are available techniques and computer programs for storing and accessing such representations. In the preferred embodiment, the binary representations are stored in a variable length bitstream defined by a starting address and a given number of bits stored in contiguous addresses. Most computers do not access bits directly in memory or disk storage, the byte is the lowest level of accessible storage. Typically, in memory and disk the bitstream is really a bunch of bytes; only in the processor itself are the bytes broken down into a bitstream through keeping track of current byte offset, current bit within current byte, and a series of shift and logical operations on bytes or words. Typically, and for the preferred implementation, pointers to "bitstreams" on disk or in memory are really pointers to the starting byte of the bitstream. In other words, each bitstream is byte-aligned and potentially padded, so the bitstream is guaranteed to start on a byte; this uses a bit of extra storage within the bitstream (an average of 4 padding bits), but requires 3 fewer bits to contain the offset of a bitstream within a file or memory range. For example, byte offset 0x400 translates into bitstream offset 0x2000 (shift left by 3). Since on average half the bits get used in the last byte, the cost of storing bitstreams in byte-aligned format is only 1 bit, because an average of 4 bits in the stream are wasted but 3 are saved in the pointer to the stream.

Figure 3:
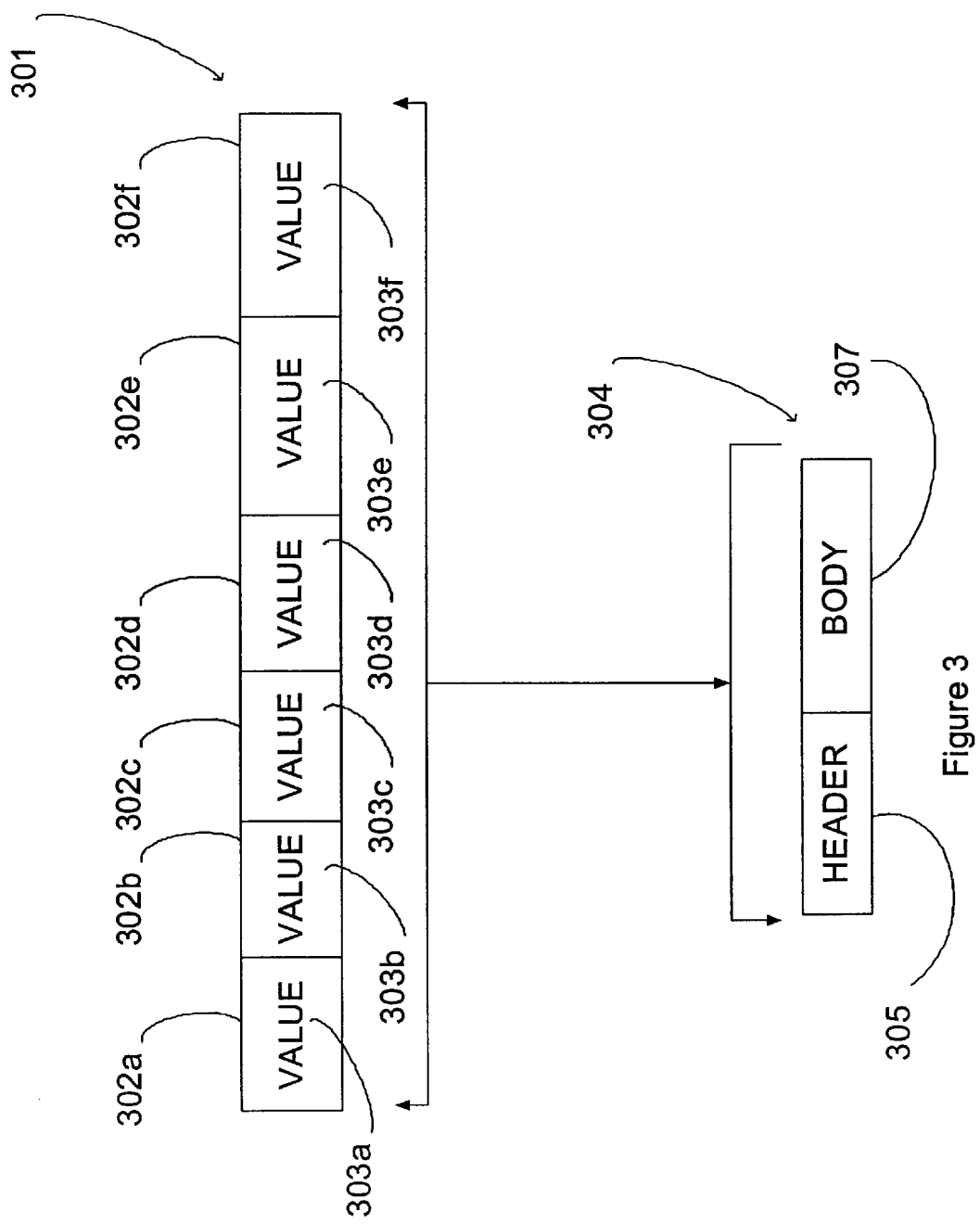
FIG. 3 is a sequence of ascending values represented in a format employing the preferred embodiment.

Referring to FIG. 3, a sequence 301 of element 302(a–e) values 303(a–e) is replaced by certain properties of the sequence 302 and by a revised sequence by embodiments of the present invention. In the preferred embodiment the properties are stored in the form of a header 305, while the revised sequence is stored in the form of a body 307. The body 307 holds a variable length bitstream as will be later described.

Figure 4:
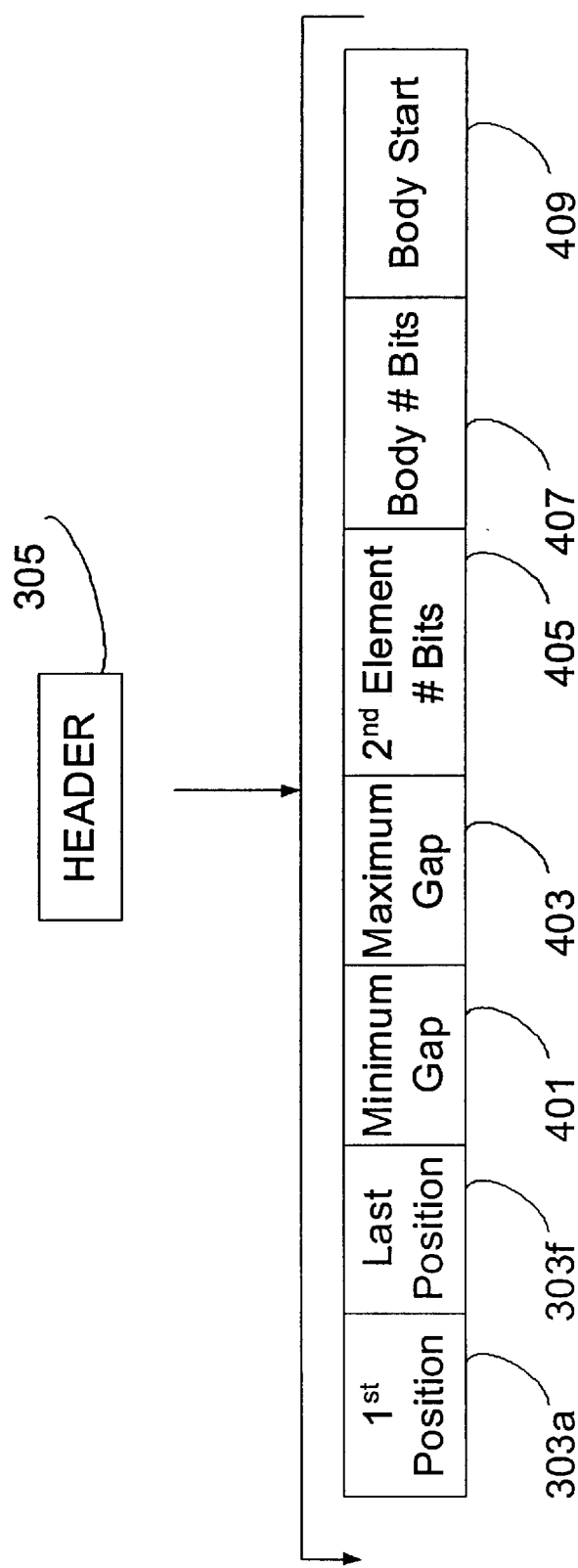
FIG. 4 is a schematic representation of a header of the format of FIG. 3.

Referring to FIG. 4, the header 305 stores the following information, the value 303a of the first element 302a in the sequence 301, the value 303f of the last element 302f in the sequence 301 (minus the first element value 303a, if reduction is utilized as described later herein), the minimum gap 401 of the sequence 301, the maximum gap 403 of the sequence 301, the number of bits 405 required to read the representation of second element value 303b of the sequence 301 from the body 307 (the second element value 303b is the first value 501b of FIG. 5 that is written in the body 307 because the first element value 303a is stored in the header 365), the number of bits 407 taken up by the body 307, and the specification 409 of the start of the body 307. In reduction, for example, if the sequence spans 7–63, the first value stores "7" in element 303a and the last value stores "56" (63–7) in element 303f. This occasionally saves a bit or two. If the first is 700007 and the last is 700063, last is stored as 56 which saves quite a number of bits. In programming terms, the specification 409 of the start of the body 307 is normally a pointer to the first bit (or byte as mentioned earlier) of the body 307. The start 409 of the body 407 combined with the number of bits 407 in the body 307 provides an indication of the end of the body 307.

Figure 5:
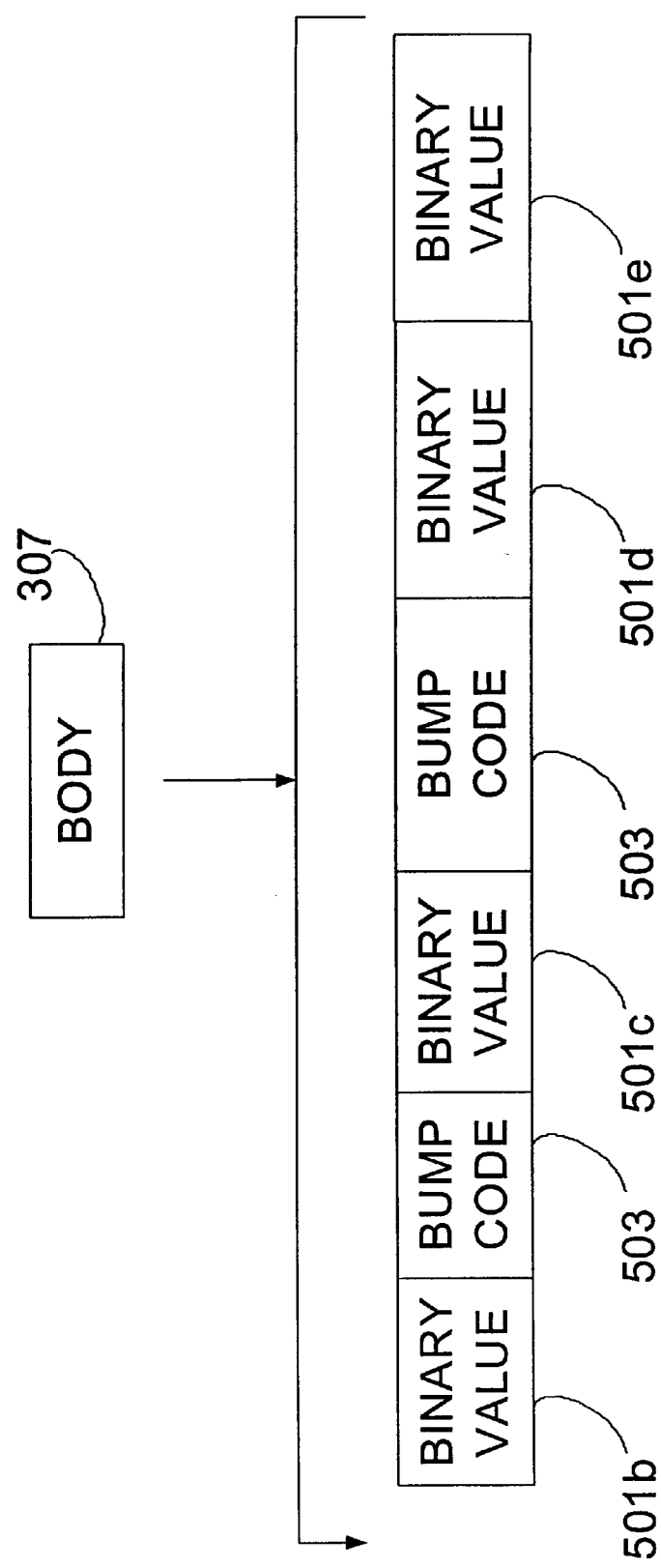
FIG. 5 is a schematic representation of a body of the format of FIG. 3.

Referring to FIG. 5, the body 307 stores a binary value 501(b–d) representative of the value 303 of each element 302 in the sequence 301 between the first element 302a and the last element 302f. Depending on the form in which the values 501 are stored in the body 307, the values 501 may be interspersed with bump codes 503. Bump codes 503 are used to resolve ambiguities that might otherwise occur when recreating the sequence element values 303 from the header 305 and body 307 information.

Figure 6:
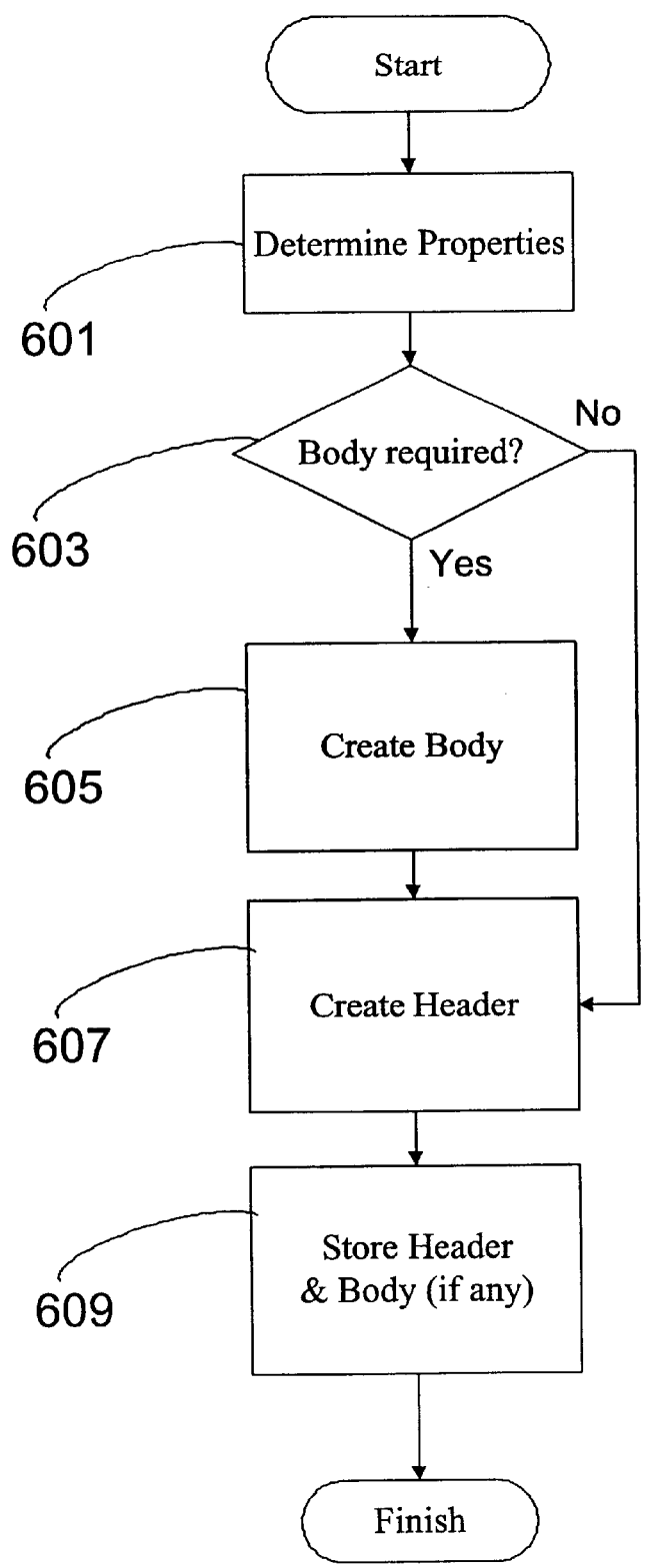
FIG. 6 is a flowchart of a method used in creating the format of FIG. 3.

Referring to FIG. 6, the compression methods embodying aspects of the present invention first determine properties of a sequence 301 at 601. It is to be noted, as is described later herein, that in some circumstances no body 307 is required to recreate the sequence 301. Accordingly, at 603 the methods determine from the properties if a body 307 is required. If so, the methods create the body 307 at 605. The methods then create the header 305 at 607 and store the header 305 and body (if any) 307 at 609.

Figure 7:
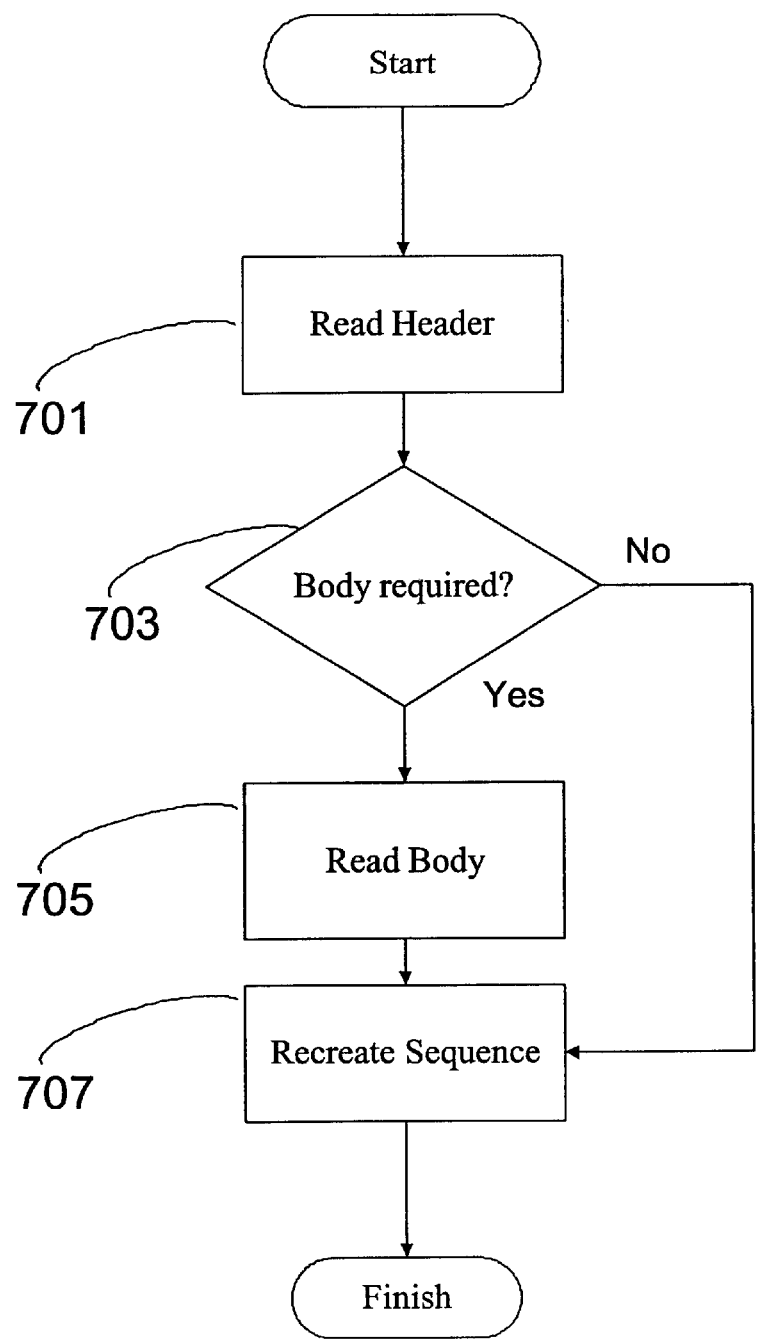
FIG. 7 is a flowchart of a method used in reading the format of FIG. 3.

Referring to FIG. 7, a corresponding decompression method embodying aspects of the present invention to that of FIG. 6 permits a sequence 301 of ascending numeric values 303 to be accessed by reading the header 305 at 701, determining at 703 if a body 307 is required and, if so, reading the body 307 at 705, and recreating the sequence 301 from the header 305 at 707 and, if necessary, the body 307.

Figure 8:
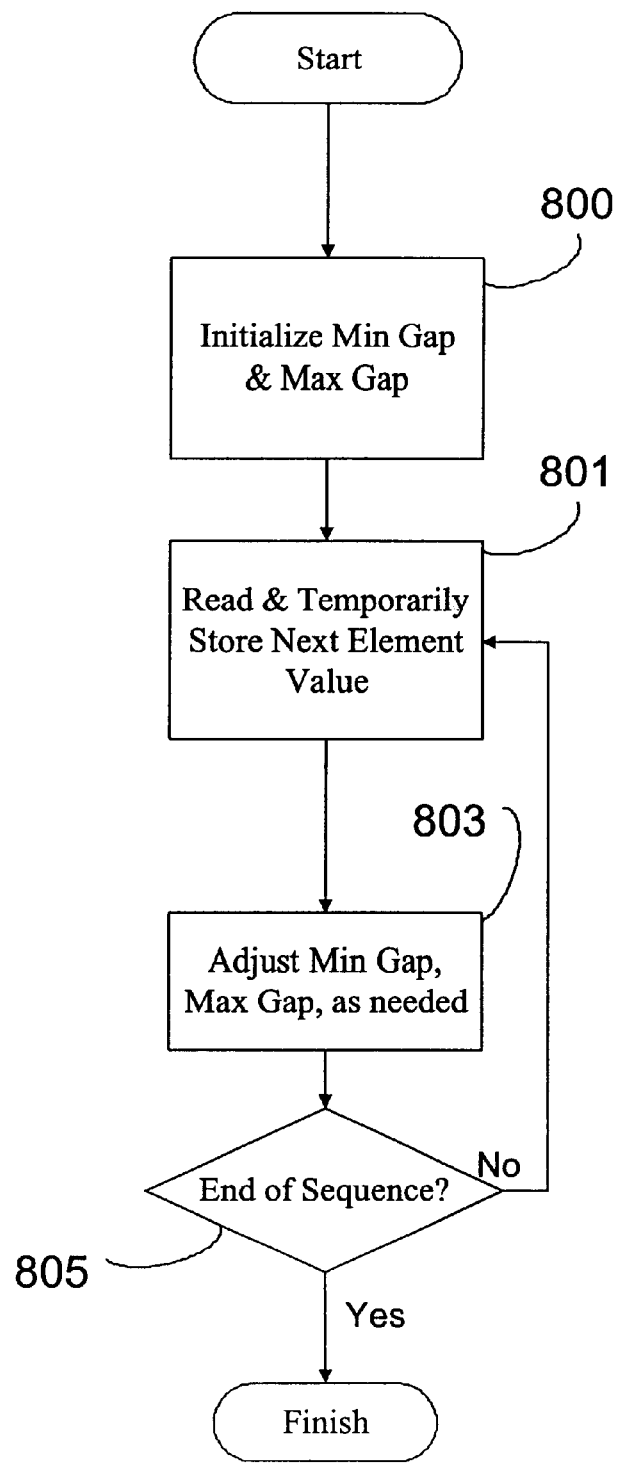
FIG. 8 is a flowchart of a method used in determining properties of an ascending sequence of values used to create the header and body of the format of FIG. 3.

Referring to FIG. 8, the minimum gap is initialized to a very large positiveinteger and the maximum gap is initialized to zero, at 800. An element value 303 of a sequence 301 of ascending numeric values is read at 801 into memory 213 for temporary storage during processing. The minimum gap 401 and maximum gap 403 are updated at 803, as required, whenever the gap between the current and previous values is greater than the current maximum gap, or less than the current minimum gap. For example, the gap between 303*d* and the previous element 303*c* is calculated; if that gap is smaller than the minimum gap for the sequence, the minimum gap is updated to that value, and if that gap is greater than the maximum gap for the sequence, the maximum gap is updated to that value. This is a standard way of computing minimum and maximum for a range, as those skilled in the art will appreciate. Other techniques may also be used.

At 805 it is determined if the end of the sequence has been reached. If not, the next value is read. If so, then the initial determining properties stage ends. The sequence may, for example, originally be stored on disk subsystem 211, retrieved from across network 205, or it may be in memory 213 from a previous processing activity.

In most cases it will be best to read the sequence 301 into a temporary array datatype for processing as an array datatype typically reserves contiguous memory addresses. In any event, array datatypes typically result in fast access times element to element. Other datatypes may be available depending on the programming environment utilized. Such datatypes can be utilized provided that they are sufficiently fast to meet the requirements of the particular application for which the program is to be used.

Figure 1:
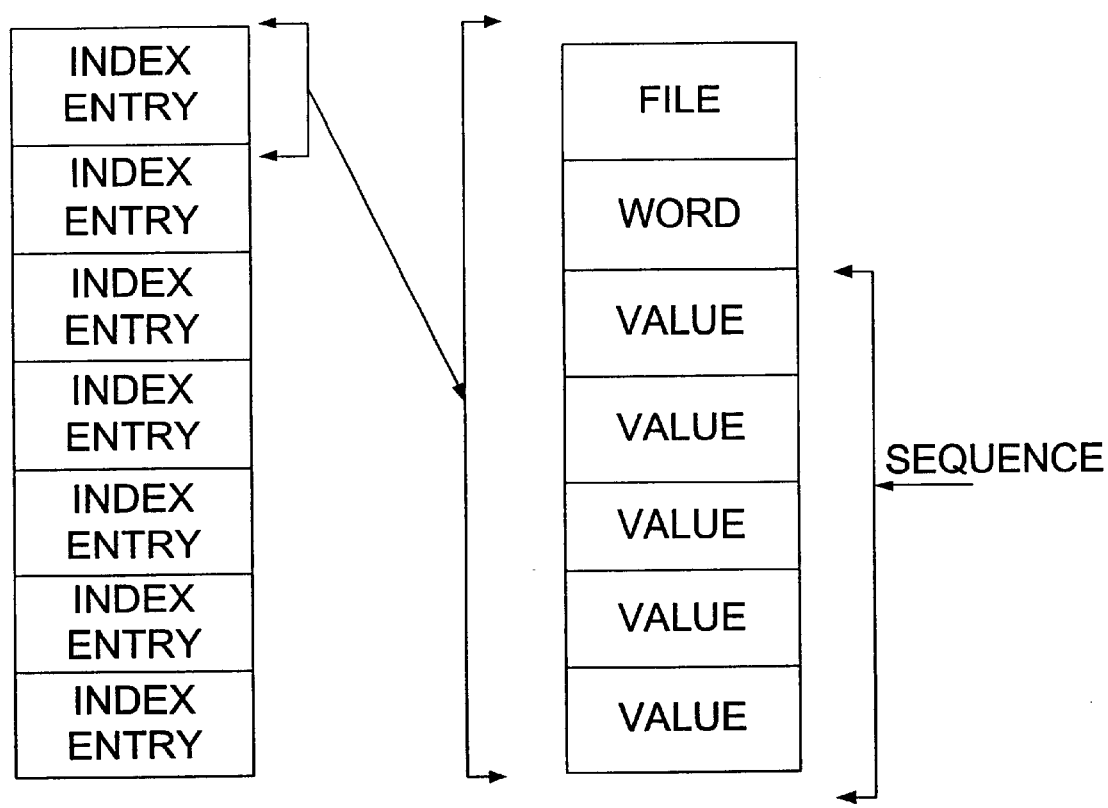
FIG. 1 is a schematic representation of index entries for a text-based search engine.

As described previously with reference to FIG. 1, in an embodiment for a search engine each sequence represents a series of offsets (position values) within a particular file for a particular word. For example, the word "computer" may appear at word positions 2, 5, 10, 27, 91 and 217 in a file containing 295 words. An array similar to that in Table 1 below will be built.

TABLE 1

| |
|---|
| 2 |
| 5 |
| 10 |
| 27 |
| 91 |
| 217 |

As the sequence values 303 are read and the array is being built, the minimum gap 401 and maximum gap 403 between values are tracked. Again, depending on the programming environment used to implement the methods described herein, the minimum gap 401 and maximum gap 403 are temporarily stored as variables for processing. In the sequence of Table 1, the minimum gap is 3 (between 2 and 5) and the maximum gap is 126 (between 91 and 217).

Figure 9:
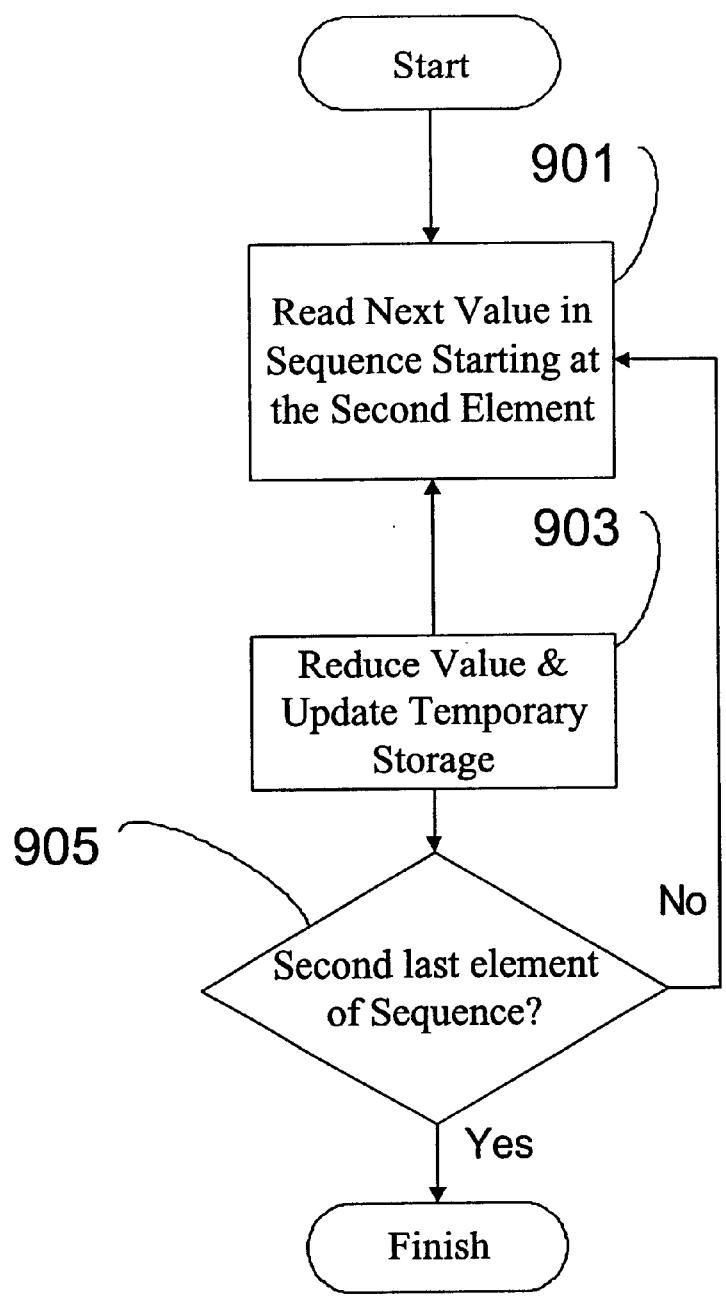
FIG. 9 is a flowchart for reducing values of the sequence as part of the method used in creating the format of FIG. 3.

Referring to FIG. 9, to begin the creation of the body, the sequence values 303 (*b–d*) between the first element 302*a* and the last element 302*f* are read at 901 in order from the temporary storage array. Each read value 303*b–d* is reduced. at 903 as it is read and the original value 303*b–d* is replaced by the reduced value. At 905 if the second last element has been reduced then the process ends, otherwise, the next element value is read.

The reducing value step 903 involves reducing each element value 303*b–d* between the first element 302*a* and the last element 302*f* (non-inclusive of the first and last elements 302*a*, 302*f*) to a smaller value using the first element value 302*a* and the minimum gap 401 as follows:

reduced element value=original element value−first element value−((minimum gap−1)×current position in sequence)

Where:

original element value is the value being reduced, first element value is the value of the first element in the sequence (also the first value in the array and the lowest possible value), minimum gap is the smallest distance between any two adjacent elements in the sequence, current sequence position in the sequence is the current element's position within the sequence (array), where position 0 is that of the first element in the sequence, and X is a multiplication sign.

For the sequence of Table 1, 2 is the first element value 302*a*, and 5 is the second element value 302*b*. 5's sequence position is therefore 1; 10's is 2; 27's is 3; and, 91's is 4. In this case there are 6 elements in the original sequence 301, and 4 elements in the sequence being reduced. This results in the values shown in Table 2 when the reduction formula is applied, where original element value 303 is shown in the first (left) column and reduced element value is shown in the second (right) column.

TABLE 2

| | |
|---|---|
| 5 | 1 |
| 10 | 4 |
| 27 | 19 |
| 91 | 81 |

In order to recover the original value of a sequence element the reverse process can be used, namely:

original element value=reduced element value+first element value+((minimum_gap−1)×current sequence position)

Referring to FIGS. 10–17, the method follows a number of rules to compress further the number of bits 407 required to store the body 307. Each rule will be described separately with reference to FIGS. 10–17 then all the rules will be combined in FIG. 17.

Figure 10:
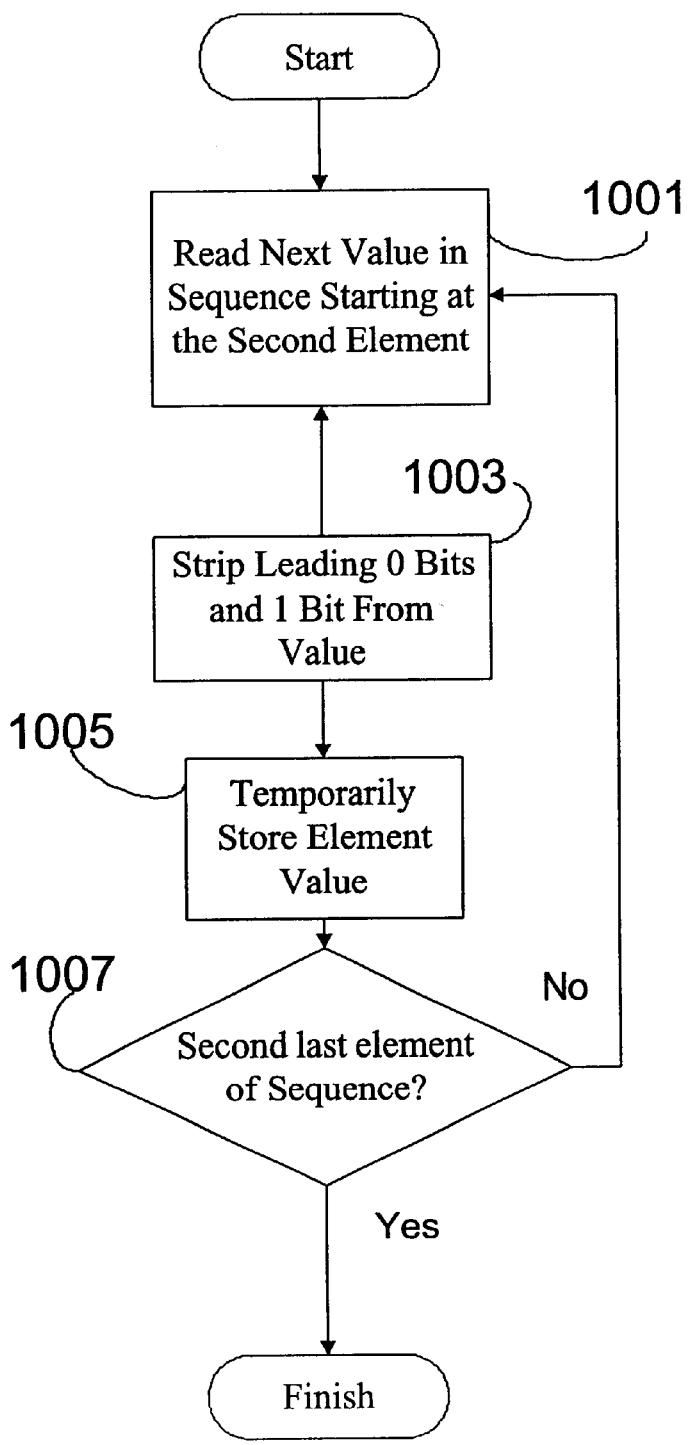
FIG. 10 is a flowchart for lessening bit length by bit stripping values of the sequence as part of the method used in creating the format of FIG. 3.

Referring to FIG. 10 and Table 3 below, one method of compressing the number of bits 407 required for body 307 involves reading at 1001 each reduced value of the sequence 301 from between the first element value and the last element value, and dropping at 1003 all leading zero bits and the first element leading one bit in a binary representation of each read reduced element value. In the preferred embodiment the reduced values are read from the temporary storage array at 1001, and then stored back to temporary storage at 1005. If the end of the second last element of the sequence (array) is reached then the leading bit dropping process ends, otherwise the next element is read at 1001.

For example, the values 100, 200, 300 and 600 require 7, 8, 9 and 10 bits to be fully represented. Thus all bits up to and including the top one bit of each is discarded because it is given that this top bit will always be 1. The lessened binary value is then temporarily stored as the value. The next value in the reduced sequence is then retrieved.

TABLE 3

| Value | Omitted Top 1 Bit | Lower Bits |
| --- | --- | --- |
| 100 | 1 | 100100 |
| 200 | 1 | 1001000 |
| 300 | 1 | 101100 |
| 600 | 1 | 1011000 |

Figure 11:
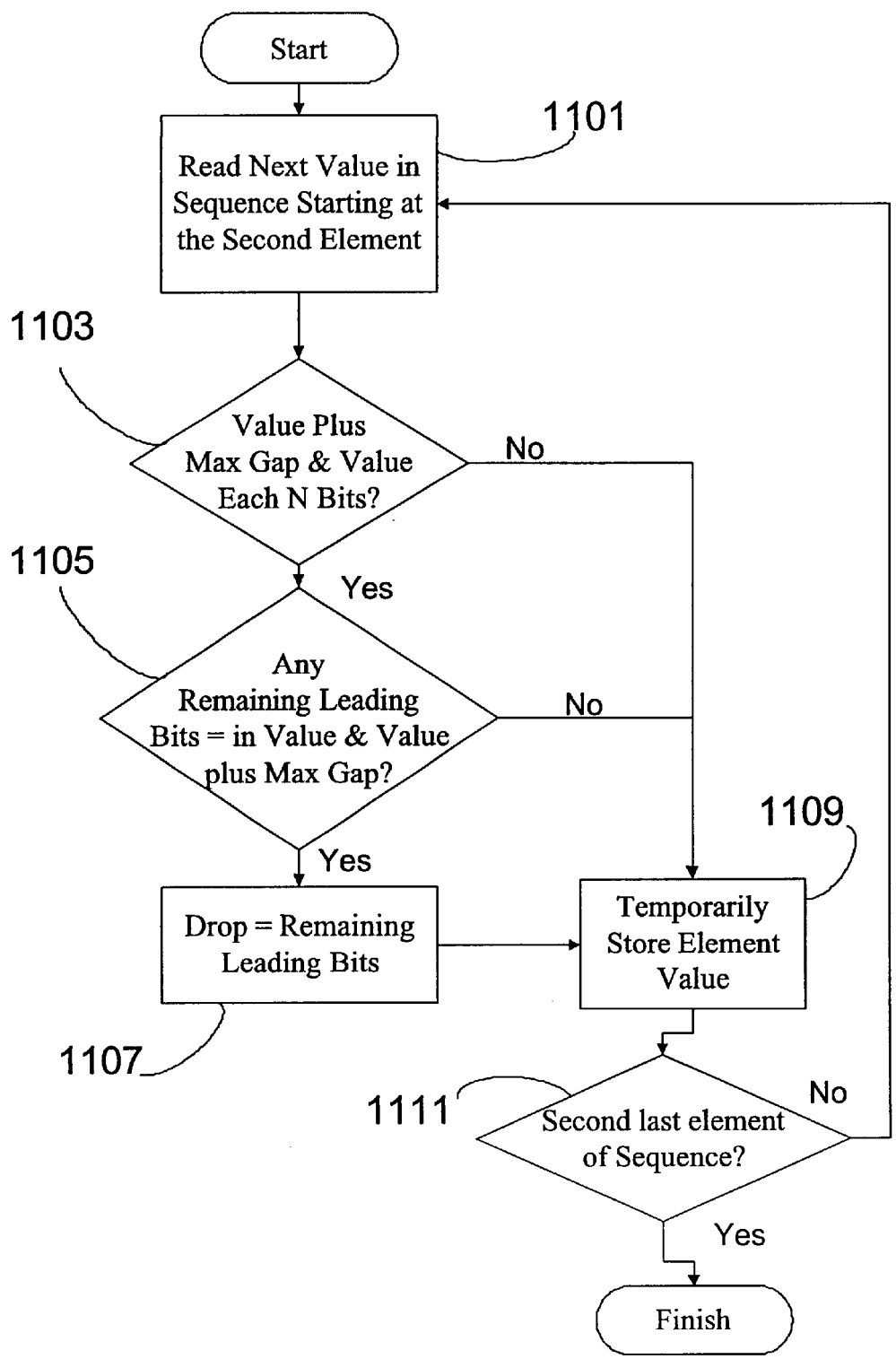
FIG. 11 is a flowchart for lessening bit length by dropping repeating leading bits of an element value in a sequence when compared against the preceding element as part of the method used in creating the format of FIG. 3.
Figure 17:
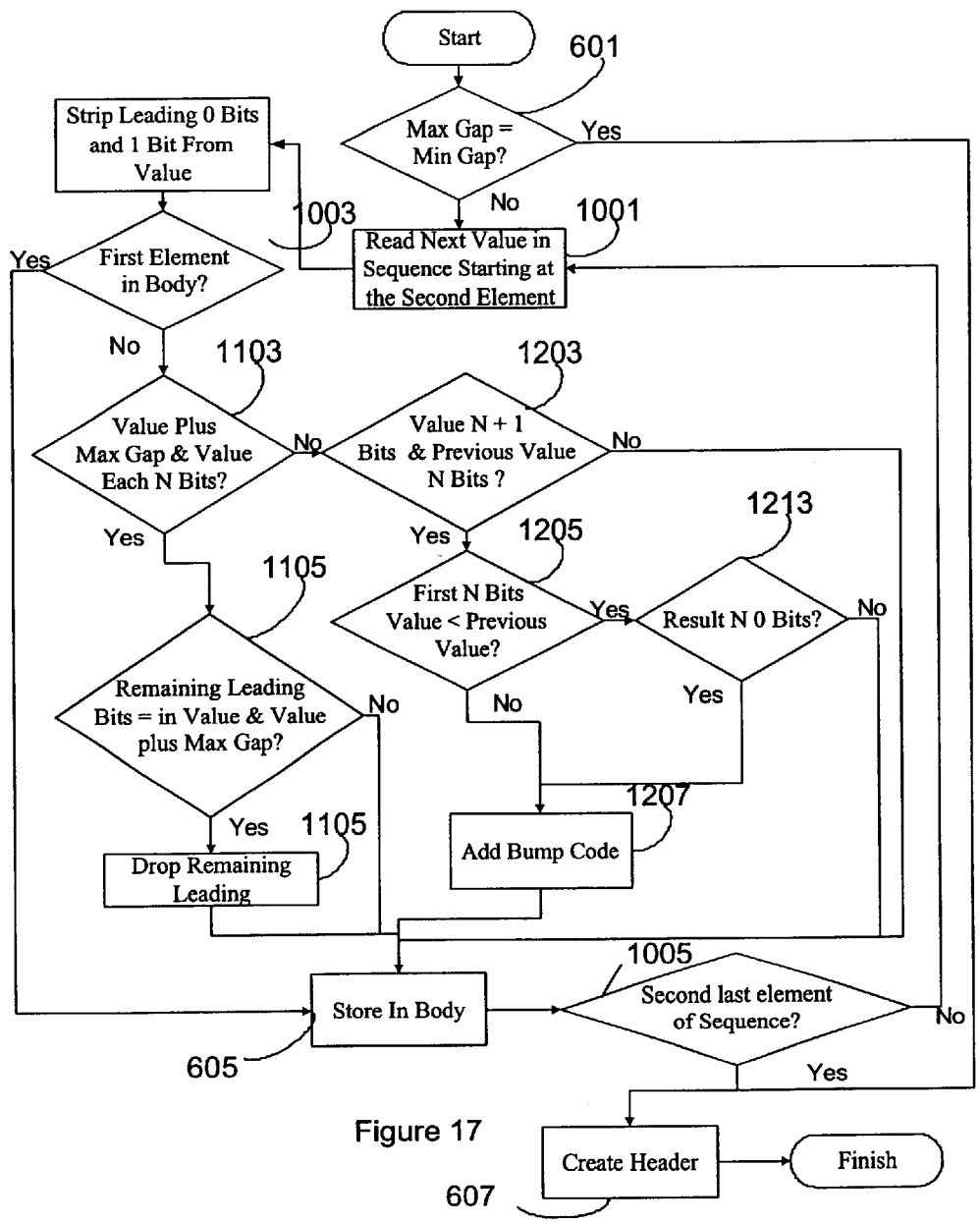
FIG. 17 is a flowchart employing the methods of FIGS. 10 through 17 for creating a header and body using the method of FIG. 6 to create the format of FIG. 3.

Referring to FIG. 11 and Table 4, another method of compressing the bits of the body involves, reading at 1101 each value of the sequence 301 from between the first element value and the last element value. The step of reading 1101 may be the same step as 1001 (and similarly, later described 1201) as shown in FIG. 17 at 1001.

If the method of FIG. 11 is used immediately following the previous bit stripping method then the read value will be the result of the bit stripped method The read value is checked at 1103 to see if the current value and that value plus the maximum gap 403 are represented with the same number of bits. It is further checked at 1105 to see if adding the maximum gap to the current value necessarily involves the higher bits of the current value being identical to the same higher bits in the subsequent value. If so, those higher bits are omitted at 1107 from the subsequent value. For example, consider a maximum gap of 5 and a current value of 231. The maximum next value is 236. Table 3 shows the eight bits required to represent each value:

TABLE 4

| Value | Omitted Top 1 Bit | Lower Bits |
| --- | --- | --- |
| 231 | 1 | 1100111 |
| 236 | 1 | 1101100 |

As can be seen, the top 3 provided bits of both values are 110. Therefore, for the subsequent value only the lowest 4 bits need be written, because no possible next value can be greater than 236.

Where two values require N bits, and the maximum gap optimization cannot be performed because no leading bits are the same, it is a given that the second value will always be higher then the first, because values are in ascending sequence. The value remains as is.

Figure 12:
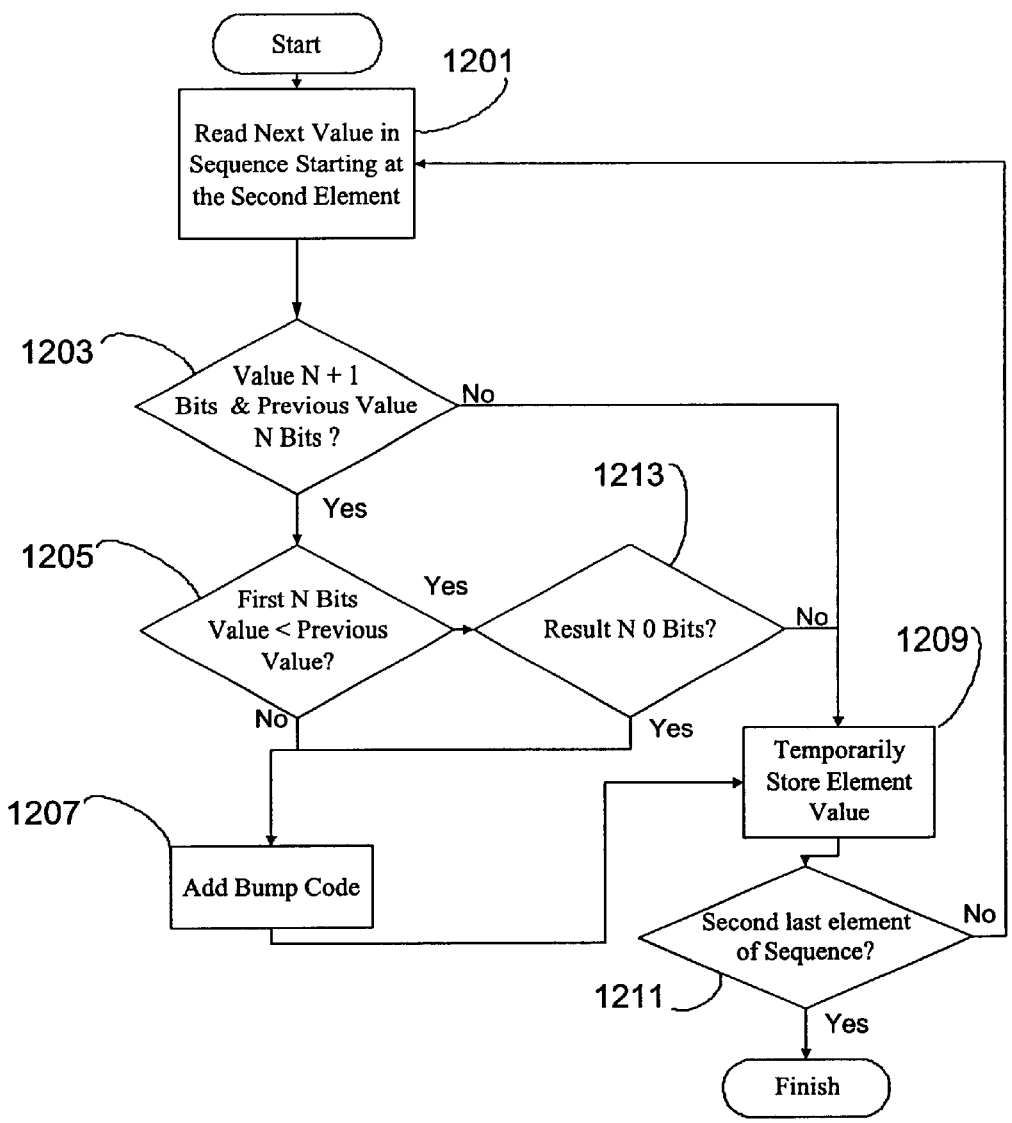
FIG. 12 is a flowchart for adding bump patterns to disambiguate element values resulting from the methods of FIGS. 10 and 11.

Referring to FIG. 12, it is recognized that simply storing the results of the bit stripping and repeating bit dropping methods can lead to ambiguity when attempting to decompress the sequence 301 from the body 307. When the second value in the body requires N+1 bits compared to N for the first, the second value can simply temporarily be stored as usual (with the omitted leading 1 bit) provided that its first N bits evaluate to a value lower than the prior value (if its first N bits evaluate to 0, this is a special case as will be described later). Each value of the sequence 301 from between the first element value and the last element value is again read at 1201. The above conditions are checked at 1203 and 1205. For example, consider the values 6 (binary 110) and 11 (binary 1011) as shown in Table 5.

TABLE 5

| Value | Omitted Top Bit | Lower Bits |
| --- | --- | --- |
| 6 | 1 | 10 |
| 11 | 1 | 11 |

It is safe to write [1]011 for the second value, because when the sequence is read, the reader, after having read 2 bits for the first value [1]10, will assume that 2 bits should be read for the second value, and will read [1]01. The decompression reader will detect that the second value is lower than the first value (101 evaluates to 5, which is lower than 6), and will therefore retrieve another bit to enforce the rule that all values must be greater than preceding values. It will retrieve the last bit to create 1011, and from then on will read 3 bits for each value until a subsequent value requires it to increase the number of bits read.

Where a value requires N bits, and the following value requires N+1 bits, but its first N bits result in a higher value than the preceding value, the assumed increase in number of bits as described immediately above cannot be performed. A bump code is thus inserted at 1207 before the value is stored. The bump code comprises a bump pattern and a bump value. The bump pattern indicates to a decompression reader that a bump value is to follow. The bump value indicates how many bits are to be read by the decompression reader in order to obtain the appropriate binary value from the subsequent sequence. In the preferred embodiment, an all zeros value at the beginning of the bump code is reserved for the bump pattern to represent an explicit bump to a higher number of bits. This bump pattern can be used both to increase the number of bits by 1, for cases where the optimization described immediately above cannot be performed, and to increase the number of bits by more than 1.

The bump value uses a Huffman encoding to indicate the number of bits to add to the current bit length. A Huffman encoding is a set of possible bit patterns of varying length, whose lengths are inversely proportional to the expected frequency of their use. In the preferred embodiment, the Huffman encoding in Table 6 follows immediately after the all-zeros value.

TABLE 6

| | |
| --- | --- |
| 1 | Bump bit count by 1 |
| 1 | Bump bit count by 2 |
| 1 | Bump bit count by 3 |
| 0 | Bump bit count by 4 |
| 1 | Bump bit count by 5 |

The last encoding requires the reading of an additional 5 bits, allowing bumps of up to 36 bits at a time. As the maximum bump value is known (5 bits), the second last entry can be an all zeros value. If more bits are required then another bump code can be used, or the Huffman encoding table can be revised. As well, an entirely different Huffman encoding can be used where it is expected that different bump values will be encountered with different frequencies. For this Huffman encoding, it has been assumed that larger bump values will be required with less frequency.

Figure 13:
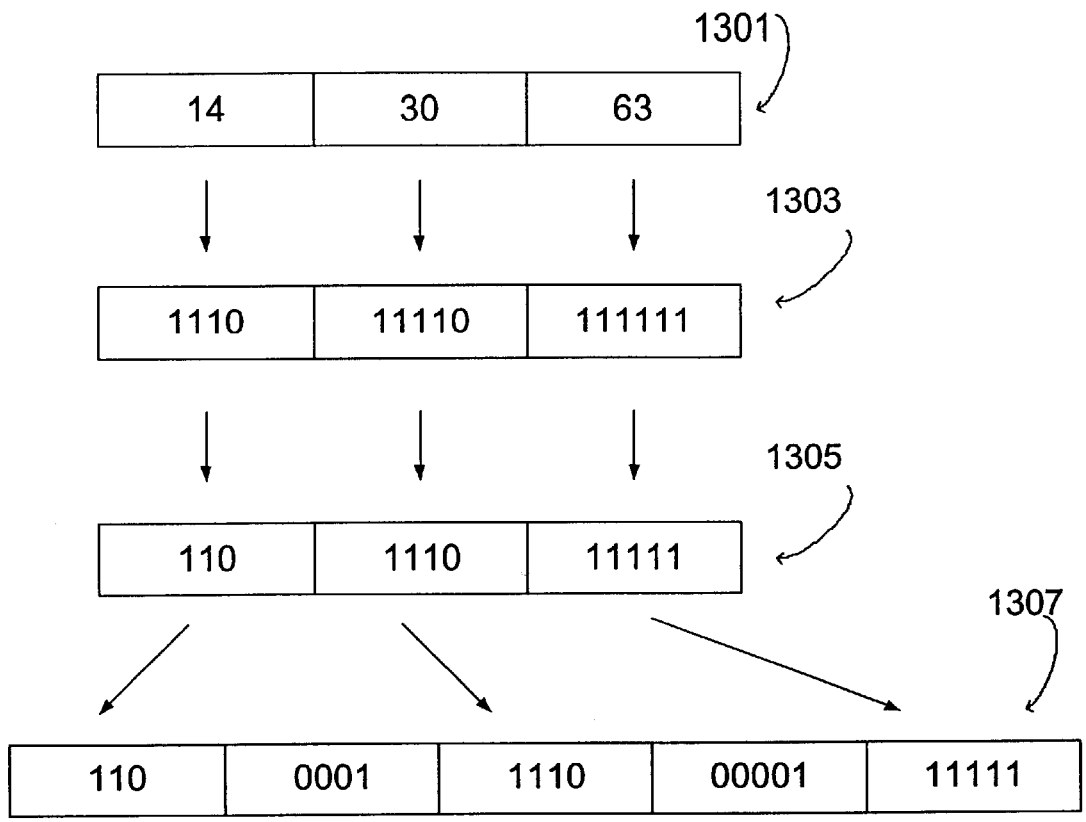
FIG. 13 is a schematic representation of the creation of a body in the format of FIG. 3 created employing the methods of FIGS. 10 and 12 on a sequence with element values having progressively longer bit length following a non-zero leading bit.

Referring to FIG. 13, consider the following sequence 1301: 14 30 63. The respective bit patterns 1303 for these values are 1110, 11110, 111111. Values 30 and 63 must be preceded by a bump code, otherwise a decompression reader will interpret the bitstream following the value 14 as more 3-bit values. After dropping the leading 1 bits to produce the sequence 1305, bump codes are inserted to produce bitstream 1307:

110 represents the value 14 with leading bit stripped.

000 indicates a bump (using 3 bits, the same number of bits that were actually read to establish the preceding value).

1 is the Huffman encoding used to indicate a bump of 1 bit 1110 represents the value 30 with leading bit stripped.

0000 indicates a bump (using 4 bits, since the preceding value, 30, involved reading 4 bits).

1 is the Huffman encoding used to indicate a bump of 1 bit bump 11111 represents the value 63 with leading bit stripped.

Figure 14:
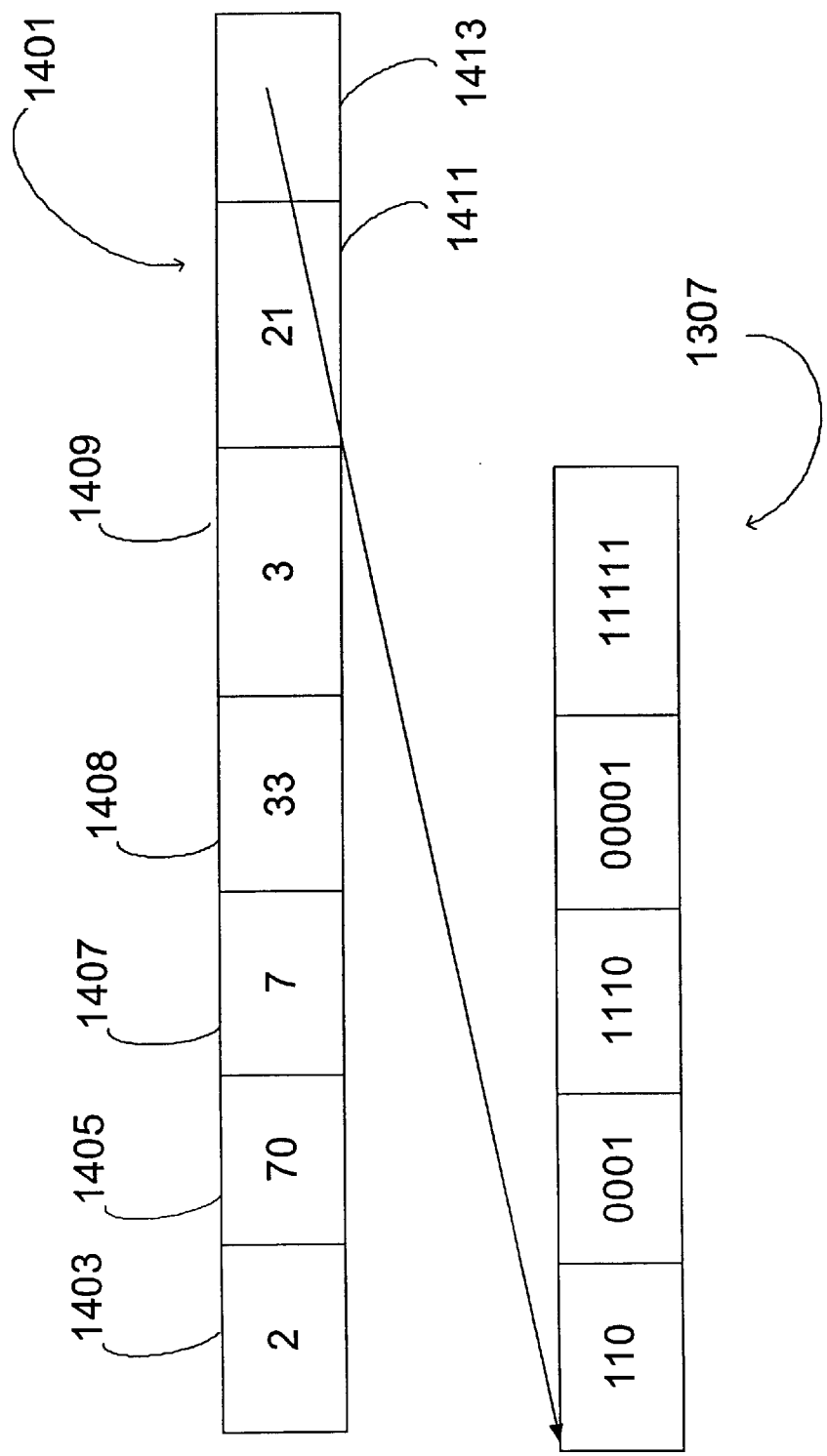
FIG. 14 is a schematic representation of a sample header pointing to the body of FIG. 13.

Referring to FIG. 14, now that the body 1307 information is known, a header 1401 can be created to store for the sequence. For example, for the sequence of FIG. 13 assume that the first and last value are 2 (1403) and 70 (1405) respectively. The minimum gap is 7 (1407), the maximum gap is 33 (1408), the second element number of bits is 3 (1409), the body 1307 number of bits is 21 (1411), and the start (1413) of the body 1307 will be dependent on the address at which the body 307 is located in the particular storage system as represented by the arrow.

Figure 15:
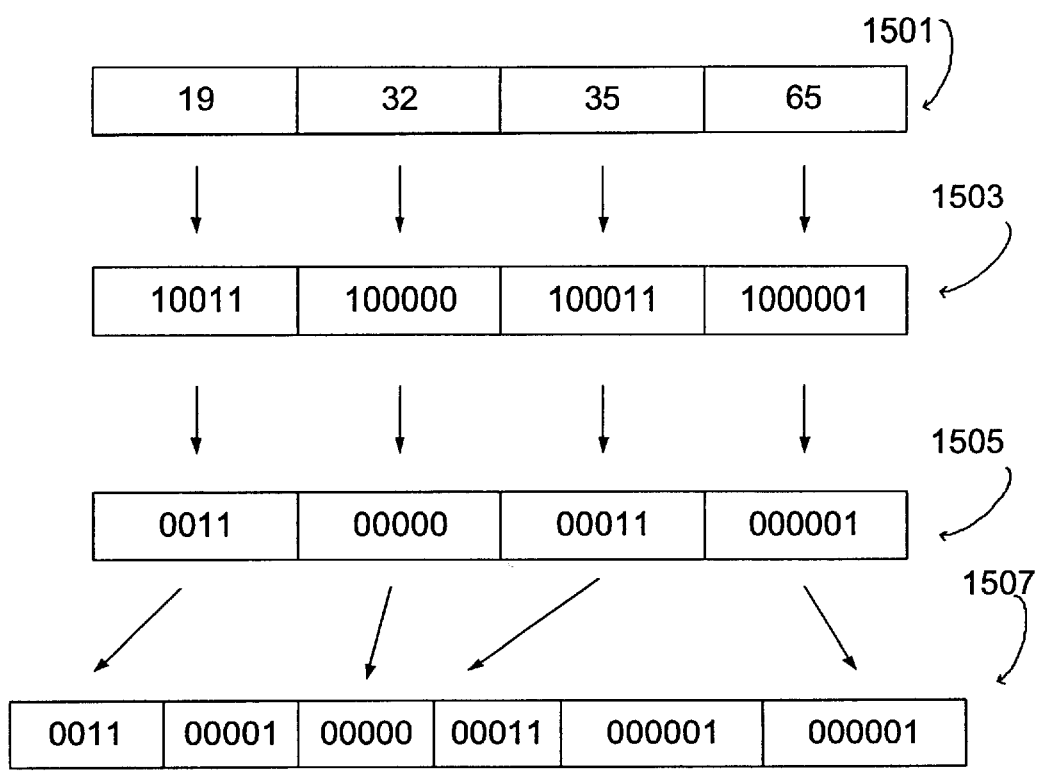
FIG. 15 is a schematic representation of the creation of a body in the format of FIG. 3 created employing the methods of FIGS. 10 and 12 on a sequence with element values that result in leading zeros of the same bit length as the bit length of the preceding element value in the sequence.

Referring again to FIG. 12 and referring to FIG. 15, where a value of N bits is followed by a value of N+1 bits, and a value of N zero bits is being written (for example, [1]00000 after bit stripping), a bump code is first inserted. If this were not done, it would be impossible to disambiguate between a bump zero value, and a zero value indicating one of the two lowest possible values at the next higher bit size.

Referring to FIG. 15 and Table 7 below, consider the sequence 19, 32, 35, 65 (1501) shown in binary order with leading bit (1503) and without leading bit (1505):

TABLE 7

| [1]0011 | 19 |
| [1]00000 | 32 |
| [1]00011 | 35 |
| [1]000001 | 65 |

For both the second and fourth values, reading the number of bits used for the preceding value would result in a zero value being read (because the leading 1 is assumed), and subsequent bits would be compared against the Huffman encoding used to determine how many bits to bump by. Therefore, this sequence needs to be padded with bump codes as shown in Table 8 to produce bitstream 1507.

TABLE 8

| [1]0011 | 19 |
| 1 | Bump by 1 bit |
| [1]00000 | 32 |
| [1]00011 | 35 |
| 1 | Bump by 1 bit |
| [1]000001 | 65 |

Another aspect of this rule is that the only two situations in which a value read as zero actually corresponds to a power of 2 (part of a binary value in the sequence) are: (1) in the very first value in the bitstream, because that value's bit length is stored in the header 305 for the bitstream; and (2) immediately after an explicit bump has been detected. The bitstream will not start with a bump code because the number of bits for the first element value in the body are known from the header.

An alternative implementation is to NOT store the number of bits required for the first body value in the header, to save header space; in this case, the assumed number of bits for the first body value is determined by the number of bits required for the first header value, and a bump code may appear at the start of the body if the first body value requires more bits than the first header value, based on the rules already described for determining when a bump value is required.

Referring to FIG. 16, again, now that the body 1507 information is known, a header 1601 can be created to store for the sequence. For example, for the sequence 1501 of FIG. 15 assume that the first and last values (1603, 1605) are again 2 and 70 respectively. The minimum gap is 3 (1607), the maximum gap is 30 (1608), the second element number of bits is 4 (1609), the body 1507 number of bits is 31 (1611), and the start (1613) of the body 1507 will again be dependent on the address at which the body 1507 is located in the particular storage system as represented by the arrow.

Referring to FIG. 6, where the minimum and maximum gap 401, 403 are the same (for example, both are 5 in the sequence 5, 10, 15, 20, 25, 30) none of the remaining data need be written, because the first and last positions and constant gap are all that is required to compute all possible values. A sequence of N, N+M, N +(2M), N+(BM) can be represented with only those four values (first position is N, last position is N+(BM), minimum and maximum gap are M). The header 305 for the above sequence in the format of FIG. 4 would be 5, 30, 5, 5. Once it is determined that the maximum gap and the minimum gap are the same, no further writing is necessary. Thus, the body required step 603 is simply a comparison of the minimum gap and maximum gap after those properties are determined at 601.

Referring to FIG. 17, each of the rules described with reference to FIGS. 10–15 are combined to produce an effective unambiguous method of compressing an ascending sequence of element values. The body storage step 605 is shown embedded in the creation process so that successive bits of the body are written into the body at the time they are created. Alternatively, the body could be temporarily stored and later stored in more permanent storage such as a disk subsystem. It is possible to also include the reduce value step 903 into the compression method of FIG. 17 between steps 601 and 1001. Performing all the steps in an integrated manner provides for the most efficient means of processing all of the methods as most values can be retrieved once into memory and written once into the disk subsystem. Disk subsystem access often consumes the most system resources and takes the longest time.

In the preferred embodiment, the process is as follows:

1. Initialize an array and set its element index to zero; read first value into element 0
2. Read each value into next slot in array; adjust mingap and maxgap if required; increment element index by 1; repeat step 2 until all values stored in array
3. Create bitstream (body) from elements 1 to N–1 of array, applying, the original value reduction plus all bit-reduction optimizations concurrently
4. Create header from elements 0 and N of array, mingap, maxgap, bits required for element 2. and length of bitstream.

In other words, the preferred embodiment does not do separate passes on the array for the phases of the initial reduction, elimination of leading one bits, adding bump codes, and eliminating common leading bits; all these steps are applied in sequence to each value once the array is created and the mingap, maxgap, first and last values are known. This is more efficient as it is only necessary to read elements from temporary storage once, and all processing can be performed in registers before storing in the bitstream.

Figure 16:
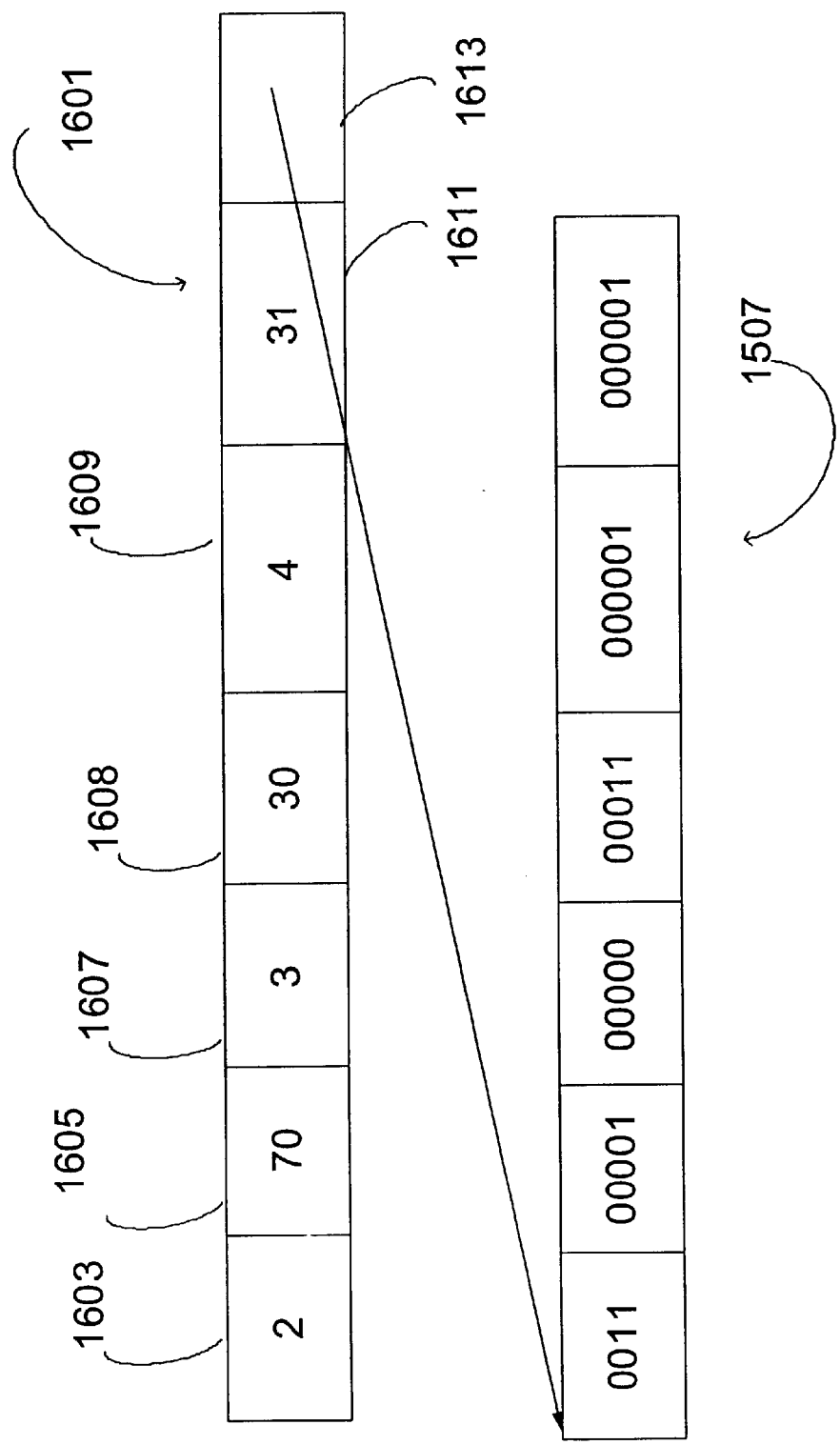
FIG. 16 is a schematic representation of a sample header pointing to the body of FIG. 15.
Figure 18:
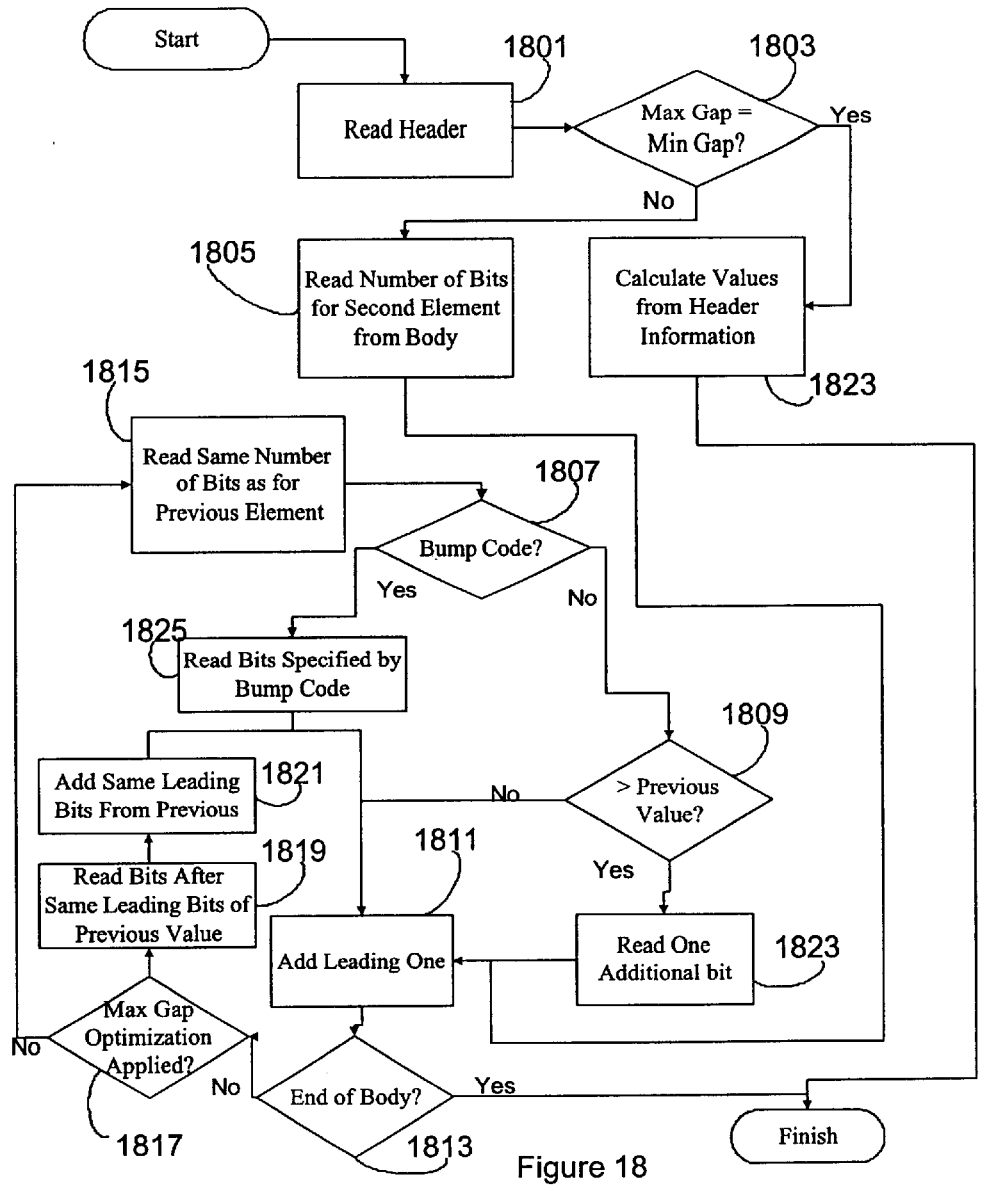
FIG. 18 is a flowchart of an embodiment of the method of FIG. 7.

Referring to FIG. 18, a flowchart for an unambiguous method of decompressing a sequence compressed according to the methods of FIG. 16 is shown. The header is read at 1801. It is determined at 1803 if the maximum and minimum gap specified in the header are the same. If so, the original sequence values 303 are computed from the first and last values and the gap value. If not, at 1805 the decompression method begins reading the body at the start of body specified in the header for the number of bits specified for the second element. If no bump code is encountered at 1807 and if at 1809 the binary value is not greater than the previous value then the leading one bit is added in at 1811 to recover the original sequence value. If at 1813 the end of the body is reached, as determined from the number of bits in the body specified by the header then all values have been recreated, the sequence has been decompressed and processing for this part of the method ceases. If not, then if maximum gap optimization (dropping the remaining bits in FIG. 11) has not been applied then the same number of bits as were read for the previous value (including any previous bump value) are read from the body at 1815, and processing continues.

If the maximum gap optimization method is being used then at 1817 it is determined if the optimization has been applied to a particular value. In the preferred embodiment this is done by reversing the process described with respect to FIG. 11, for example, the maximum gap is added to the preceding element value. If leading bits are the same in the preceding element value and the preceding element value plus the maximum gap then it is assumed that maximum gap optimization has been applied and the number of bits in the portion that is not the same are read at 1819 from the body, and the leading bits that are the same are added in at 1821 from the previous element value, and processing continues.

If on the other hand at 1809 the previous value is not greater than the preceding value then one more bit is read at 1813 before the one bit is added at 1811, and processing continues.

If at 1807 a bump code is encountered then the number of bits specified by the bump code are read from the body at 1825 to make up the binary value (less the stripped bit). The stripped bit is then added in at 1811, and processing continues.

In some situations the storage required for the bitstream and for the header 305 describing the bitstream may be greater than the storage required simply to write all the values out in the header 305. Experimentation conducted during development of the preferred embodiment indicated that where 8 or fewer values are being written, storing these values in the header 305 is generally a more efficient use of disk space than storing them in an optimized bitstream and also storing descriptive header 305 values, these values are written in the header 305 itself in place of the conventional header 305 values of first, last minimum and maximum gap, second value bits, and so on. The values are written using a Huffman length/value encoding, in which Huffman codes are used to indicate the bit length of each value, and a value follows its length code. Each value is stored as the distance between the prior value and itself, to reduce the number of bits required to store it.

In tests to further compress the data stream resultant from using the above methods, a standard ZIP compression algorithm using aggressive compression settings only compresses the data a further 1 to 2%. This suggests that the methods result in highly efficient output from a storage perspective. Other tests have shown that a search engine having an index utilizing the methods discussed herein achieves an index size, at least in one case, of one-fifth to one-tenth the size of indices of comparable search engines.

Reducing the storage requirements for data often results in improved performance when the data is being written to disk or read from disk, because disk access is much slower than memory access. Some compression algorithms are sufficiently complicated, and some disk subsystems sufficiently fast, that there is in fact no benefit to compressing the data because the processor overhead required to compress or decompress is greater than the disk I/O overhead required to store or read the data in uncompressed format. The present methods, however, use a sufficiently straightforward set of rules to describe data with particularly limited characteristics to ensure that the reduced I/O time is not offset by a corresponding or greater increase in processing time.

There are many applications in which numeric data is stored in ascending sequences. For example, search engines may organize occurrence data in the following hierarchy:

Word N
File Z
Position A B C
File Y
Position D E F
File X
Position G H I.

Account number validation systems, for example credit card lookup databases, could store credit card numbers from all financial institutions in a set of records (one each for stolen, expired, active, overextended credit) with each record containing an ascending sequence of card number values. The methods described herein might speed up checks of a large set of account numbers to see which of them are stolen or overextended (since most numbers would not be in either range: a large percentage of credit card account numbers are invalid, while most of the valid ones are either active or expired rather than stolen).

Similarly, any computer system for storing unique numeric values for social security numbers, social insurance numbers, student ID's, numeric car registration numbers, etc. where each element is unique, the values span a wide range, and fast lookup to validate a number (without necessarily accessing its full record) is required.

The methods can also be applied to transaction processing systems, wherein timestamps for transactions are stored as part of the transaction, as a numeric value (e.g. number of microseconds since Jan. 1, 1600). Because timestamps of successive transactions are always in ascending sequence, the methods could be used to store very accurate timestamps for a massive number of transactions over a large number of years, with very little storage or lookup overhead for each transaction. This would apply to storing banking transactions for a large bank; web site transactions for an e-commerce website; message transactions for a mail server or communications controller; wherever these applications require easy, fast, low-storage-overhead storage and retrieval of transaction timestamps. In such an application the timestamp data could be stored separately from other data concerning each transaction (i.e. as the current method describes) but the bitstream could equally be divided up so that each transaction contained the timestamp bits it needed from the sequence.

The methods may be applied to process control and environmental state monitoring where it is desired to be known at what timestamps an event occurred. These sequences of events can be so large that the methods are very useful for storing the sequences. Examples: Timestamps when a manufactured item (e.g. paper carton) is rejected by an automated inspection process during manufacture, so that statistical process control specialists can analyze a year's worth of data to determine correlations between high rejection rates and seasonal, time-of-day, and other factors; timestamps when a detection device detects a trace of a pollutant being monitored; and timestamps when the price of spot-market electricity changed. For each of the above, it is possible to include, embedded in the sequence data, other data relating to each event, provided there is a method provided to encode the length of each non-sequence value within the sequence.

The methods may be applied to storage of the expansion data for astrophysical explosion, thermonuclear explosion, or other thermal explosion (real or simulated data), for example, the ever-increasing distances, from the fixed starting point where the Big Bang is assumed to have occurred, for particles in the universe at successive points in time, or the ever-increasing distances, from the point of a nuclear or thermal explosion, of the particles making up the explosive as they move away from the point of explosion and from one another. This would be useful, for example, in modeling the state of the universe in the seconds after the Big Bang, and storing that state efficiently for subsequent access.

Referring to FIG. 20, the methods may be applied to storage of sparse graphical states in a bitmap representation, where a bitmap of N dimensions is divided into a contiguous range of numeric values representing points in the graphical universe. For example, given that a shape in any N-dimensional space can be represented by a series of bits (a 0 bit for a unit within that space that does not contain the shape, and a 1 bit for any unit that does contain the shape), the positions in which 1-bits occur is a sequence. FIG. 19 displays a bitmap of an image of a vase and flower. The position of each "X" in the bitmap (non-blank dot) is shown in Table 9 below, where the first dot (dot 1) is at top left, and dots are read from left to right in rows, and rows are read from top to bottom.

TABLE 9

31 32 34 35 36
50 53 55 57
69 74 75 76
89
105 106 107 108 109 110 111 112 113
126 127 131 132
147 148 150 151
165 166 172 173
184 185 193 194
204 295 213 214
225 226 232 233
247 248 249 250 251

This would be stored, in bitmap form, as a series of 0 and 1 bits, with one bit for each "." or "x" in the image, from top left spanning right and then down to bottom right, where a 0 bit indicates a "." and a 1 bit indicates a "x". This could also be written as the sequence of locations indicated in Table 9, where each value is equal to "row number times 20+column number". This application is suitable for storing the shape of any sparse graphical object that cannot be represented as efficiently by spline polynomials. While the flower and vase example probably results in less efficient storage than the bitmap it replaces, depending on the nature of the represented shapes (percentage of space covered by shape, distribution of shape, etc.) the methods described herein could in some cases lead to much more efficient storage. The methods can be inverted for dense shapes, by representing the sequence of blank bits rather than the sequence of non-blank bits.

Other examples include an extension of the graphical image example described above, in which any sampled data is stored in linear form as a sparse array, for example, positions in a 3-dimensional space with a 0 bit for each intersection of dimensions and time during which the particle is not detected, and a 1 bit for each intersection where the particle is detected, then the entire sampling range can be indicated efficiently, and reconstituted from physical storage quickly, by storing it as an ascending sequence using the methods in this application.

In database technology, any inverted lists that store pointers to matching records can be stored using the methods described herein. For example, if a set of entries contains an integer field for EMPLOYEE_AGE_IN_YEARS, and the acceptable ranges are 16–130 (assuming no employee is under legal working age or older than the oldest person now living), a database system might create an inverse list index to speed up searches fr a given age. That is, when a user asks for a list of all records where AGE=38, instead of the database system reading each record looking for that value, it uses a prebuilt list of matching records for the given age. The prebuilt list consists of a set of records, one for each possible AGE value, in which the sequence for each record is the ascending sequence of employee record numbers that match that age value.

In data sorting programs, any application that sorts numeric values before storing (because order does not matter) becomes an ascending (or descending) sequence. Note that in this case, the methods described herein require a slight modification to allow for zero gaps between successive values (i.e. minimum gap=0, where the sequence might start 1 1 1 2 2 3 4 5 6). This modification is achieved by simply setting minimum gap to zero and applying the other aspects of the methods as usual. For example, a census application could sort the age (or the birthdate, in days since Jan. 1, 1800), of each resident of a country, and could store this as an ascending sequence. It could then very quickly determine how many residents are between 38 years, 3 months and 4 days old, and 49 years, 2 months and 8 days old, or how many were born in a given date range.

The methods can also be applied to geological applications in which core sample strata are dated. As the dates at different levels in a core sample are always in a one-way sequence, these strata, once dated using any available technique (C12, zircon, trace element presence, etc.) can have their date information stored as a sequence, in years, back from an arbitrary point (present or past).

The methods can also be applied to telephone router systems that store the sequences of valid telephone numbers accessible from each router in a network as an ascending sequence. A telephone router system could apply the methods to determine quickly which router to send a telephone number to, where the telephone number itself does not provide a clue.

Similarly, the methods can be applied to IP addresses in computer network router systems as telephone routers apply to phone numbers.

The methods can be applied to cryptography applications, in which a continually ascending value is used as part of the computation involved in determining a continually changing cipher key. As a simple example, a file containing a set of ascending sequences is stored on two computers in a public network, but other computers cannot access this file. When data is transmitted from one computer to the other, it is scrambled as follows:

A first value indicates the sequence number to use as the starting point for encryption/decryption The first value in that sequence is used as a key to encrypt the first N bits of transmitted data The next value in that sequence is used as a key to encrypt the next N bits of transmitted data Each subsequent N bits of data is encrypted using a subsequent key When one sequence is exhausted, the next sequence is used; when the last sequence is exhausted, key retrieval wraps to the first sequence.

The methods may be applied to geographical information systems, in which the locations of particular types of objects (e.g. city fire hydrants, sewer grates) can be represented as ascending sequences in a two- or three-dimensional space, converted into a linear array. For example, a GIS could store the X times Y co-ordinates, down to the 1-meter accuracy level, of all fire hydrants, sewer grates, traffic lights, street lamps, etc. in a city using an ascending numerical sequence for each, where the resulting values are linearized to be inserted to the sequence, and dimensionalized when removed (similar to the bitmap issue discussed previously).

Applications that store decreasing sequence of values can be adapted to the methods described herein by subtracting each value from the top value before applying the remainder of the methods. For example, the sequence 100 96 90 81 60 32 12 1 can be written be rewritten by subtracting 100 from each value to yield 0 4 10 19 40 68 88 99, and then applying the remainder of the method. This is essentially converting "how much gasoline is in my tank" to "how much gasoline have I burned so far". This permits the methods to be applied to many other applications, such as:

Applications to measure, store, or retrieve the amount of potential energy remaining in a falling object or in an energy source that is being depleted Applications to measure, store, or retrieve sampling data for temperature changes during an energy-producing reaction (in this case, one might have two sequences: an ascending sequence measuring how many millidegrees of temperature increase occur while the reaction is producing energy, and a descending sequence measuring how many millidegrees of temperature decrease occur as the substance returns to ambient temperature).

While the methods described herein are most beneficial where an entire sequence is characterized by minimum and maximum gaps that are fairly close together, it is still within the scope of the invention to split a large sequence into multiple smaller ones, if the resulting header 305 and data bitstream can be stored more efficiently then a single header 305 and data bitstream representing the sequence.

Specifically, if a large sequence is characterized by a small number of tightly knit shorter sequences, with large gaps between those shorter sequences, it may be more efficient to break the larger sequence up into several headers and bodies so that values within each smaller sequence can be reduced by a greater amount using the intial reduction process described in FIG. 9 at 903. Further, where a very large number of ascending values are anticipated, such as event timestamps in a continuing process monitoring environment, it may be desirable to write the sequence out in ranges of 1000 elements, so that by the time element 1001 of the sequence is made available by the process monitoring subsystem, values 1–1000 have already been stored in a compressed format as described herein.

It will be understood by those skilled in the art that this description is made with reference to the preferred embodiment and that it is possible to make other embodiments employing the principles of the invention which fall within its spirit and scope as defined by the following claims.

I claim:

1. A method of compressing ascending order numerical data in a computer system, the method comprising:

a) Determining the minimum and maximum gaps between the data set;

b) Reducing all values in the data set except for the first and last values using the formula:

reduced element value=original element value−first element value−((minimum gap−1)×current position in sequence);

Where:
original element value is the value being reduced,
first element value is the value of the first element in the sequence (also the first value in the array and the lowest possible value),
minimum gap is the smallest distance between any two adjacent elements in the sequence,
current sequence position in the sequence is the current element's position within the sequence (array), where position 0 is that of the first element in the sequence, and
X is a multiplication sign;

c) Storing for each sequence the first and last values, the number of bits required to represent the reduced second element, the number of bits required to store the entire sequence; and d) Discarding all leading zeros bits and first non zero bits.

2. A method of encoding a sequence of elements of ascending numerical value, the method comprising:

a) Reading the sequence of elements of ascending numerical values from a medium using a computer system;

b) Determining a minimum gap and a maximum gap of the sequence;

c) Reducing each element value according to the following:

reduced element value=original element value−first element value−((minimum gap−1)×current position in sequence);

Where:
original element value is the value being reduced,
first element value is the value of the first clement in the sequence (also the first value in the array and the lowest possible value),
minimum gap is the smallest distance between any two adjacent elements in the sequence,
current sequence position in the sequence is the current element's position within the sequence (array), where position 0 is that of the first element in the sequence, and
X is a multiplication sign;

d) In a binary representation of each reduced value, stripping any leading zero bits and the first non-zero bit;

e) Storing the resulting values in a body as a bitstream; and f) Storing in a header the first value, last value, minimum gap and maximum gap of the original sequence, the number of bits in the first value in the body, and an indicator of the start and the end of the body.

3. The method of claim 2, further comprising: after stripping leading bits, if the reduced value and the reduced value plus the maximum gap have the same number of bits and there are any remaining leading bits that are the same in the reduced value and the reduced value plus the maximum gap then dropping the remaining leading bits that are the same.

4. The method of claim 2, further comprising: after stripping the leading bits, if the current stripped value has N+1 bits and the previous stripped value in the sequence has N bits and the value of the first N bits of the current stripped value is not less than the previous stripped value then inserting in the body before the current stripped value a bump code to the number of bits in the current stripped value.

5. The method of claim 3, further comprising: after stripping the leading bits, if the current stripped value has N+1 bits and the previous stripped value in the sequence has N bits and the value of the first N bits of the current stripped value is not less than the previous stripped value then inserting in the body before the current stripped value a bump code to the number of bits in the current stripped value.

6. The method of claim 4, further comprising: after stripping the leading bits, if the current stripped value has N+1 bits and the previous stripped value in the sequence has N bits and the value of the first N bits of the current stripped value is less than the previous and the stripped value has N zeros bits stripped value then insert in the body before the current stripped value a bump code to the number of bits in the current stripped value.

7. The method of claim 2, 3 or 5 further comprising: after the determining step, if the maximum gap is the same as the minimum gap then only storing in a header the first value, last value, minimum gap and maximum gap of the original sequence, and not storing a body.

8. A method of decoding a sequence of ascending numerical values from a header and an optional body of data comprising:
   a) Reading the header from a medium utilizing a computer system to obtain for a sequence the first element value, last element value, minimum gap, maximum gap;
   b) If the body exists then reading the header to obtain an indication of the start of the body and the end of the body;
   c) Determining if the minimum gap and the maximum gap are the same, and if so then computing the sequence of values from the header;
   d) If the minimum gap and the maximum gap arc not the same then decoding a first binary value in the body from a medium using a computer system and adding in a leading bit;
   e) Reading the next value;
      i) If the read binary value is not a bump code and the value is not greater than the previous binary value then reading one additional bit from the body and adding a leading one bit to the actual binary value to obtain one of the sequence of values;
      ii) If the read binary value is not a bump code and the value is greater than the previous binary value then adding a leading one bit to the actual binary value to obtain one of the sequence of values;
      iii) If the read binary value is a bump code then reading the number of bits specified by the bump code to obtain the actual binary value and then adding a leading one bit to the actual binary value to obtain one of the sequence of values; and
   f) If the value is not the last value in the body, continuing at reading the next value above.

9. The method of claim 8, wherein reading the next value comprises:
   if leading bits of the value were dropped on encoding because the bits were the same as in the preceding value then reading the number of bits from the preceding value after the leading bits that are the same, then, adding in the leading bits that are the same and adding a leading one to the value, and continuing at f), and
   if leading bits are not the same then continuing to read the same number of bits from the body as for the previous value, and continuing at f).

10. The method of claim 9, wherein the header stores the number of bits for the first binary value in the body, and if the current value is the first value in the body then decoding the first binary value by reading a number of bits stored in the header for the first binary value, and adding an additional bit to the value, and continuing at f) above.

11. The method of claim 2, wherein the original sequence values represent the word or character positions of succeeding occurrences of a particular text word in a digital file.

12. The method of claim 2, wherein sequence values are derived from a sequence of descending numeric values by subtracting succeeding values of the descending sequence from the first descending sequence value then performing the encoding of the derived sequence values.

13. The method of claim 2, wherein the original sequence values are stored in the header and no body is created in the event that the sequence contains 8 or fewer elements.

14. The method of claim 2, wherein the original sequence values represent credit card numbers having a particular property selected from one of stolen, expired, active, or overextended.

15. The method of claim 2, wherein the original sequence values represent the unique numeric ID values for fast validation lookup.

16. The method of claim 2, wherein the original sequence values represent timestamps for a transaction.

17. The method of claim 2, wherein the original sequence values represent expansion data for thermal explosions.

18. The method of claim 2, wherein the original sequence values represent a bitmap of a graphical image.

19. The method of claim 18, wherein the bitmap may represent a 3-dimensional space.

20. The method of claim 19, wherein the original sequence values represent an inverted list of pointers to matching records.

21. The method of claim 2, wherein the original sequence values represent sorted numeric values including succeeding values that can be equal to the preceding value.

22. The method of claim 2, wherein the original sequence values represent the sequence of telephone numbers accessible from a router in a network in ascending order.

23. The method of claim 2, wherein the original sequence values represent the sequence of IP addresses available from a computer network router system.

24. The method of claim 2, wherein the original sequence values are values used in a crytographic application to encrypt successive groups of bits of transmitted data.

25. The method of claim 2, wherein the original sequence values represent locations within geographical information systems of a particular object.

26. The method of claim 2, wherein the original sequence values represent the amount of potential energy remaining in an object or energy source.

27. The method of claim 2, wherein the original sequence values represent timestamps for process control and environmental state monitoring events.

28. The method of claim 2, wherein the original sequence values represent temperature changes during an energy-producing reaction.

29. The method of claim 2, wherein the ascending sequence is broken down and encoded as a set of headers and bodies.

30. A system for encoding a sequence of elements of ascending numerical value, the system comprising:
   a) Means for reading the sequence of elements of ascending numerical values from a medium using a computer system;
   b) Means for determining a minimum gap and a maximum gap of the sequence;
   c) Means for reducing each element value according to the following:

reduced element value=original element value−first element value−((minimum gap−1)×current position in sequence);

Where:
   original element value is the value being reduced,
   first element value is the value of the first element in the sequence (also the first value in the array and the lowest possible value),
   minimum gap is the smallest distance between any two adjacent elements in the sequence,
   current sequence position in the sequence is the current element's position within the sequence (array), where position 0 is that of the first element in the sequence, and
   X is a multiplication sign;
   d) Means for, in a binary representation of each reduced value, stripping any leading zero bits and the first non-zero bit;
   e) Means for storing the resulting values in a body as a bitstream; and
   f) Means for storing in a header the first value, last value, minimum gap and maximum gap of the original sequence, the number of bits in the first value in the body, and an indicator of the start and the end of the body.

31. A system for encoding a sequence of elements of ascending numerical value, the system comprising:
   a) A computer system;
      i) to read the sequence of elements of ascending numerical values from a medium using a computer system;
      ii) to determine a minimum gap and a maximum gap of the sequence;
      iii) to reduce each element value according to the following:

reduced element value=original element value−first element value−((minimum gap−1)×current position in sequence);

Where:
      original element value is the value being reduced,
      first element value is the value of the first element in the sequence (also the first value in the array and the lowest possible value),
      minimum gap is the smallest distance between any two adjacent elements in the sequence,
      current sequence position in the sequence is the current element's position within the sequence (array), where position 0 is that of the first element in the sequence, and
      X is a multiplication sign;
      iv) in a binary representation of each reduced value, to strip any leading zero bits and the first non-zero bit;
      v) to store the resulting values in a body as a bitstream; and
      vi) to store in a header the first value, last value, minimum gap and maximum gap of the original sequence, the number of bits in the first value in the body, and an indicator of the start and the end of the body.

32. Encoded digital data on a medium, the digital data comprising:
   a header and an optional body, wherein the header comprises data representing a minimum gap of a sequence of ascending values, a maximum gap of the sequence, the first value of the sequence and the last value of the sequence and, the number of bits in the first value of the body, an indication of the start and the end of the body; and
   the body comprises a bitstream of binary values representing the sequence values between the first element value and the last element value, each sequence value having been reduced as follows:

reduced element value=original element value−first element value−((minimum gap−1)×current position in sequence);

Where:
   original element value is the value being reduced,
   first element value is the value of the first element in the sequence (also the first value in the array and the lowest possible value),
   minimum gap is the smallest distance between any two adjacent elements in the sequence,
   current sequence position in the sequence is the current element's position within the sequence (array), where position 0 is that of the first element in the sequence, and
   X is a multiplication sign;
   and the leading zero bits and leading one bit of each reduced value having been stripped.

* * * * *